United States Patent [19]
Okumura

[11] Patent Number: 5,650,947
[45] Date of Patent: Jul. 22, 1997

[54] LOGIC SIMULATION METHOD AND LOGIC SIMULATOR

[75] Inventor: Takaaki Okumura, Kasugai, Japan

[73] Assignees: Fujitsu Limited, Kawasaki; Fujitsu VLSI Limited, Kasugai, both of Japan

[21] Appl. No.: 377,404

[22] Filed: Jan. 24, 1995

[30] Foreign Application Priority Data

Jan. 31, 1994 [JP] Japan .................................. 6-010119
Oct. 18, 1994 [JP] Japan .................................. 6-251791

[51] Int. Cl.$^6$ ............................................... G06F 17/00
[52] U.S. Cl. ............................................ 364/578; 364/488
[58] Field of Search ............................ 364/485, 578; 395/500

[56] References Cited

U.S. PATENT DOCUMENTS

| | | | |
|---|---|---|---|
| 4,787,061 | 11/1988 | Nei et al. | 395/500 |
| 4,827,427 | 5/1989 | Hyduke | 364/489 |
| 5,018,089 | 5/1991 | Kanazawa | 364/578 |
| 5,053,980 | 10/1991 | Kanazawa | 364/578 |
| 5,105,373 | 4/1992 | Rumsey et al. | 364/578 |
| 5,384,720 | 1/1995 | Ku et al. | 364/578 |
| 5,392,227 | 2/1995 | Hiserote | 364/578 |
| 5,426,768 | 6/1995 | Kanazawa | 395/500 |
| 5,467,462 | 11/1995 | Fujii | 364/578 |

*Primary Examiner*—Vincent N. Trans
*Attorney, Agent, or Firm*—Staas & Halsey

[57] ABSTRACT

A method is disclosed to execute an event driven logic simulation to check the function of a logic circuit, by using a logic simulator. The logic simulator includes at least one data base and a processing unit having a dummy element synthesizer. The dummy element is a tool for detecting changes in signals at a target cell or a target terminal. At the time that the logic simulation starts, the dummy element synthesizer produces the dummy element defining data, referring to or based on information stored in the data base, and combines the dummy element defining data and the logic circuit design data. Thus, for example, timing simulation at a target cell in the logic circuit or the check of the number of times of changes in signals at a target output terminal of the logic circuit, is executed during the event driven logic simulation.

15 Claims, 17 Drawing Sheets

LOGIC SIMULATION METHOD AND LOGIC SIMULATOR

BACKGROUND OF THE INVENTION

1. Field of the Invention

The present invention relates to a logic simulator and a method to simulate logic for use in designing semiconductor integrated circuits, and particularly, large scale integration (LSI).

2. Description of the Related Art

LSI-oriented circuits are generally designed using a computer aided design (CAD) system. To inspect whether a particular circuit design functions properly, a logic simulator incorporated in the CAD system simulates the logic functions of the designed circuit. For example, it is important for a flip-flop circuit, as a sequential circuit, to be subjected to timing simulation including the set-up and hold timing during logic simulation. Accordingly, the logic simulator is also used for the timing simulation. Given the increases in the size and scale of modern LSI circuits, micropatterning and operation speeds, in particular, timing simulation has become an essential simulation tool. It is important, therefore, that logic simulators accurately execute timing simulation.

In general, semiconductor integrated circuits (ICs) are designed using data recorded in a library file (i.e., library data base) provided in the CAD system. The library file holds data of various logic cells. To prepare the library file, a library designer first describes cell design information in a text format by using a circuit editor. This cell design information already includes cell definitions and timing simulation definitions. Each cell definition consists of a net list, i.e., data about the elements the network between the elements forming a logic cell. Each timing simulation definition contains information about a dummy element virtually coupled to one of the elements of a logic cell. This definition forms the basis for the timing simulation.

The application program for preparing library data converts the text data of the cell design information into data in the format that can be handled by the logic simulator. The converted data is registered in the library file.

While designing a logic circuit using the data in the library file, a dummy element is inserted into one cell which needs timing simulation. FIG. 1 exemplifies a designed cell 70. The cell 70 includes an AND gate 71, inverters 72 and 74 and a flip-flop circuit 73. The flip-flop circuit 73 is the target element for which the timing simulation of input signals at its clock pin CK and data pin D should be carried out, and therefore a dummy element 75 is connected in parallel to the pins CK and D. It is to be noted, however, that the dummy element 75 is not normally displayed even when the design of the cell 70 is displayed on the display screen.

In the conventional timing simulation, the logic simulator simulates the timings based on the circuit design data including dummy element data. The conditions used to simulate signal timing at or between the input pins of the dummy element are registered in the logic simulator. When the timing results fail to satisfy predetermined conditions, the logic simulator resolves or attributes this as a timing error.

The conventional timing simulation method requires that the designed data of each cell should previously contain data about the dummy element. The cell must be designed accompanying the dummy element. Consequently, timing simulation is always executed, even during preliminary logic simulation when the initial stage of the proposed logic design is tested to see if the design functions as expected. This reduces the speed of the preliminary logic simulation. Generally speaking, a dummy element is often connected to a circuit element which is relatively frequently driven, such as a clock element in a logic circuit. This therefore increases the burden on the logic simulator.

In addition, each dummy element has its own specific operation, and therefore the number of necessary operations is governed by the number of types of the dummy elements. If an additional simulation item is required for a circuit element, it will be necessary to add another type of dummy element to the circuit element. This addition of dummy elements is disadvantageous in as much as it increases the time necessary to execute the simulation.

Furthermore, the conventional method is applicable only to individual cells, therefore, it is essentially impossible to execute intercell timing simulation. The recent increases in the scale of semiconductor ICs renewed the demand for faster and faster simulation. In this respect, therefore, there is a demand for fast logic simulation absent the element of timing simulation performed at the initial stage of circuit design.

One suggested approach to reduce the amount of data necessary to describe the circuit to be simulated, has been to use truth tables to represent individual cell function. This approach, however, makes it impossible to connect a dummy element to each of the elements incorporated in a cell. Accordingly, as shown in FIG. 2, a dummy element 77 should be connected to external terminals 76a, 76b and 76c of a cell 76 whose logic functions are defined as a truth table. However, this means that the existing dummy elements cannot be used for the cell 76 in a truth table form. Novel dummy elements compatible with truth table approach would have to be developed. If new dummy elements are produced case by case, the number of various types of dummy elements would be enormous. This would vastly increases the difficulty of managing or accounting for the dummy elements.

Furthermore, a method has been proposed to check for the occurrence of an error by sending the output signal of a dummy element as an "X" signal up to an external terminal of the circuit when the dummy element detects such the error. However, the cause of an error depends on the structure of each cell, requiring dummy elements designed for individual purposes. Therefore, even according to this method, the various type of dummy elements would increase dramatically, thereby complicating the management of the dummy elements.

SUMMARY OF THE INVENTION

Accordingly, it is a primary objective of the present invention to allow a person, who designs a logic circuit using a CAD system, to handle definitions used for timing simulation, thereby suppressing the increase in the types of dummy elements.

It is further object of this invention to improve the logic simulation speed by reducing the amount of circuit data to be subjected to logic simulation when no timing simulation is demanded.

To achieve the foregoing and other objects and in accordance with the purpose of the present invention, an improved method is provided, which executes an event driven logic simulation of a circuit to test the design of logic cells forming the circuit by using a simulator.

According to the first aspect of the present invention, logic circuit design data and timing simulation definition are separately prepared, and stored in a first data of the simulator. The timing simulation definition describes the conditions under which a target cell is subjected to timing simulation. At the time that the event driven logic simulation starts, the logic circuit design data and timing simulation definition are loaded into a processing unit of the simulator. The processing unit includes a dummy element synthesizer, which produces data defining a dummy element to detect signal levels at the target cell, referring to the timing simulation definition, and combines the dummy element data and the logic circuit data. Therefore, the timing simulation at the target cell is executed during the logic simulation.

According to the second aspect of the present invention, logic circuit design data and check terminal definition are separately prepared, and stored in the first data base of the simulator. The check terminal definition is for designating a target terminal of a circuit to be subjected to signal change synchronism check, which is defined as a check operation for detecting the number of times of changes in signals at the target terminal within a predetermined unit time period to determine whether the detected number is equal to or below a predetermined allowable number of times. Check criteria information used in the signal change synchronism check is stored in a second data base of the simulator. At the time that the event driven logic simulation starts, the logic circuit design data and check terminal definition are loaded from the first data base into the processing unit.

The dummy element synthesizer in the processing unit selectively loads the check criteria information from the second data base into the synthesizer, referring to the check terminal definition. The synthesizer produces data defining a dummy element to detect changes in signals at the target terminal, based on the check terminal definition and the check criteria information. The dummy element defining data is combined with the logic circuit data, so that the signal change synchronism check at the target terminal is executed during the logic simulation.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings.

FIGS. 3 through 16 illustrate a first embodiment according to the present invention:

FIG. 3 is a block diagram showing a logic simulator;

FIG. 4 is a flowchart illustrating a process executed by the logic simulator shown in FIG. 3;

FIG. 5 is a flowchart illustrating a process executed by an event processor/register shown in FIG. 3;

FIG. 6 is a flowchart illustrating a timing simulation which is executed by the event processor/register;

FIG. 7 is a diagram illustrating the hierarchical structure of an LSI;

FIG. 8 is a diagram showing an example of a logic circuit;

FIG. 9 is an explanatory diagram of a flip-flop circuit with a clear terminal;

FIG. 11 is a diagram showing a differential input type logic cell;

FIG. 12 is a timing diagram illustrating in-phase periodic signals in the logic cell shown in FIG. 11;

FIG. 13 is an explanatory diagram showing a clock buffer;

FIG. 14 is a timing diagram illustrating the width of a pulse from the clock buffer shown in FIG. 13;

FIG. 15 is an explanatory diagram illustrating procedures of preparing a library file shown in FIG. 3; and FIG. 16 is an explanatory diagram illustrating procedures of preparing a circuit file shown in FIG. 3.

FIG. 17 is a block diagram showing a logic simulator;

FIG. 18 is a diagram exemplifying an LSI;

FIG. 19 is an explanatory diagram illustrating procedures of preparing a circuit file;

FIG. 20 is a flowchart illustrating a process executed by an event processor/register;

FIG. 21 is a flowchart illustrating a process for registering an event;

FIG. 22 is a flowchart illustrating a process for detecting a change in a signal;

FIG. 23 is a schematic diagram showing the data structures in a time wheel and a dummy element; and FIG. 24 is a chart for explaining a way of counting events.

DETAILED DESCRIPTION OF THE PREFERRED EMBODIMENTS

First Embodiment

A first embodiment of the present invention will now be described referring to FIGS. 3 through 16.

Figure 1:
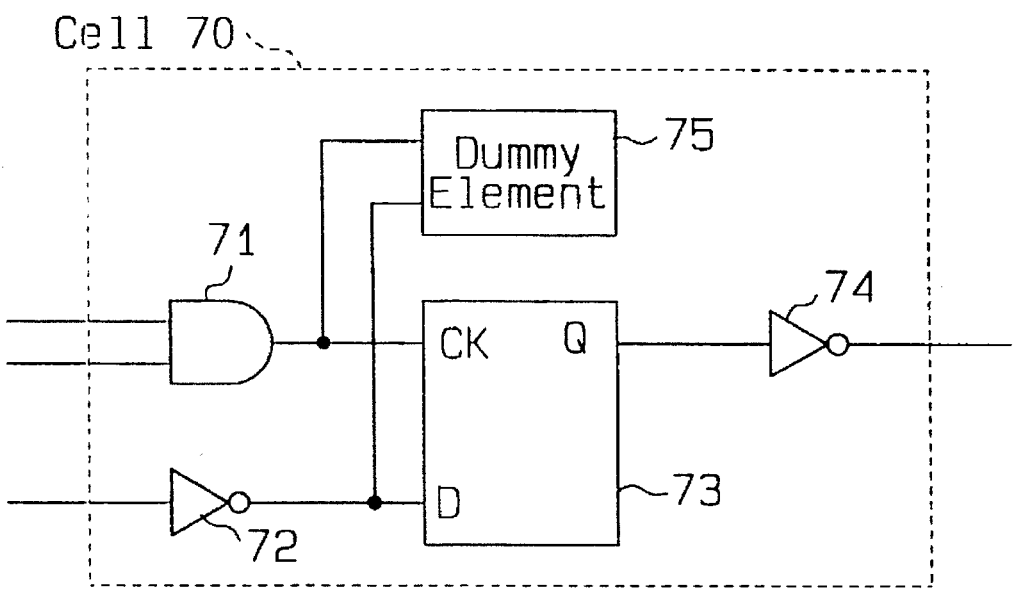
FIG. 1 is a diagram illustrating the layout of a cell designed based on a conventional method.
Figure 2:
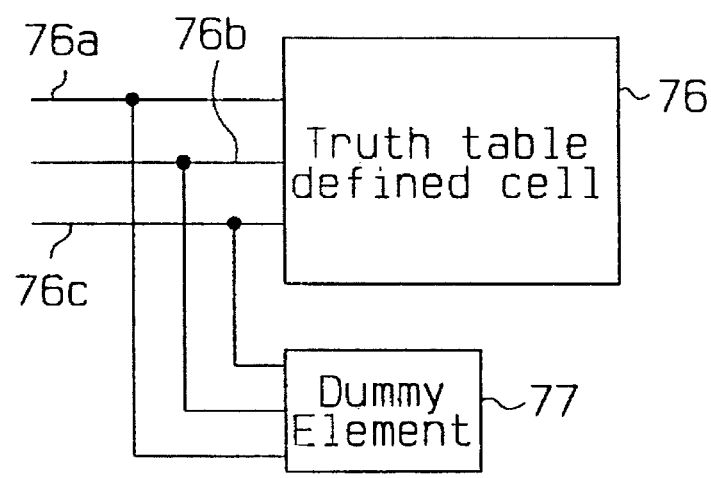
FIG. 2 is a diagram illustrating the layout of a cell defined in a truth table form based on a conventional method.
Figure 3:
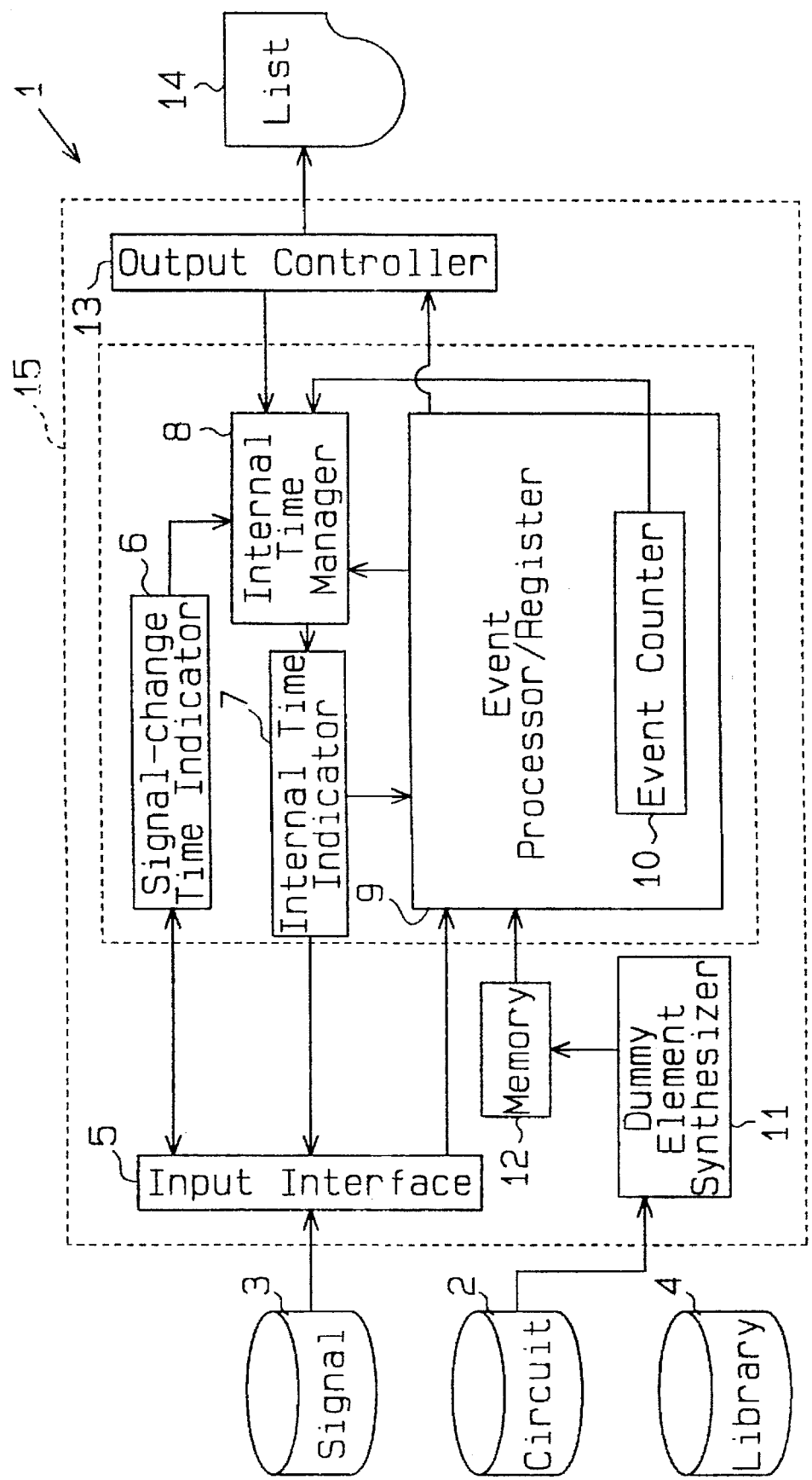

FIG. 3 shows a logic simulator 1 incorporated in a CAD system for designing semiconductor integrated circuits. As shown in FIG. 3, the logic simulator 1 comprises a circuit file 2, a signal file 3 and a library file 4 as data bases. The logic simulator 1 further has a processing unit 15 formed by a computer and individual programs that run on the computer. This processing unit 15 includes a signal input interface unit 5, a signal-change time indicator 6, an internal time indicator 7, an internal time manager 8, an event processor/register 9, an event counter 10, a dummy element synthesizer 11, a semiconductor memory 12 and a signal output controller 13.

The library file 4 stores data about basic logic cells, prepared in advance by a library designer.

Figure 8:
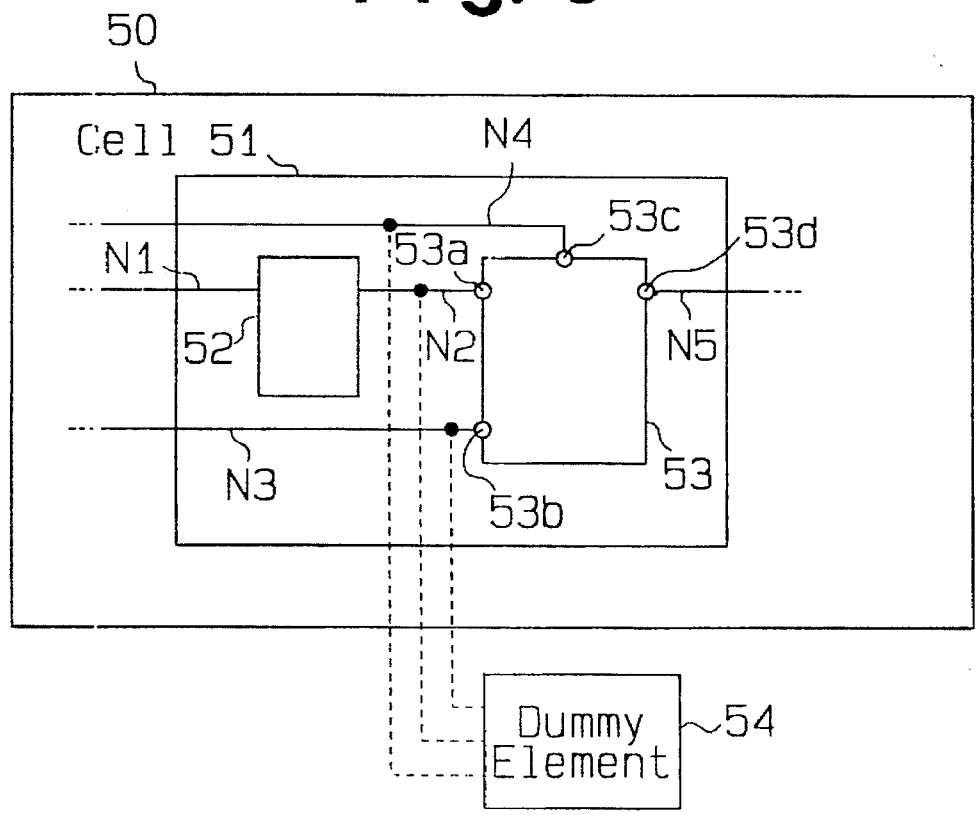

The circuit file 2 stores net lists, i.e., logic circuit data for LSIs including plural pieces of logic element data and net data about the networks between the logic elements. FIG. 8 shows one example of a logic circuit 50 corresponding to one of circuit data registered in the circuit file 2. The circuit 50 includes a middle-scale cell 51, which includes logic cells 52 and 53 and nets N1 to N5.

Figure 16:
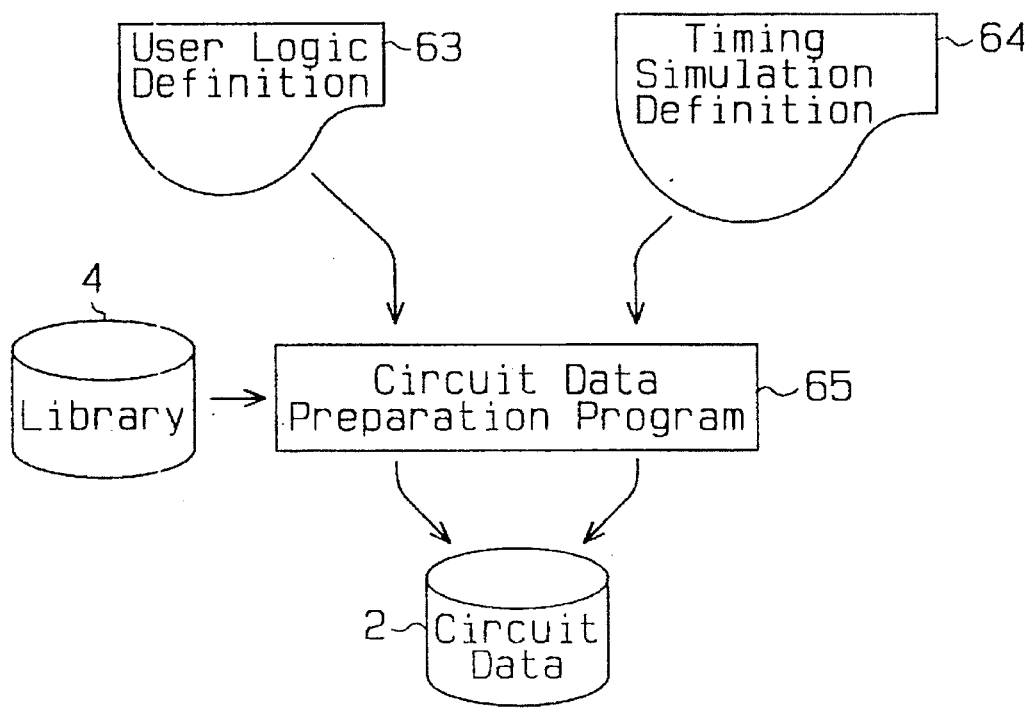

Data in the circuit file 2 is prepared in the procedures as illustrated in FIG. 16. First, a user or circuit designer prepares a user logic definition 63 and a timing simulation definition 64, both of which are written in text formats. The user logic definition 63 can be prepared by designating circuit data about a desired function (e.g., determination, NAND) in the library file 4.

An LSI is designed with a hierarchical graded rank structure in accordance with the units of individual circuits incorporated in the LSI. The timing simulation definitions 64 are defined for each rank in the LSI. Each simulation definition 64 includes a start condition for starting the timing simulation, a continuation condition for maintaining the timing simulation and an end condition for terminating the timing simulation. For instance, a chip CP shown in FIG. 7 includes a macro A02 as a lower hierarchical rank. The macro A02 includes an input terminal (In) and a logic cell A01. When the timing simulation of the macro A02 is needed, the input terminal (In) of the macro A02 is defined as, for example "A02 #In", which corresponds to the described start condition. Each simulation definition 64 may further include a specified value used to determine the accuracy of the result of the timing simulation, a definition defining an operation which causes a timing error, and a definition of a message representing the occurrence of that error.

A circuit data preparing apparatus (not shown) reads data defined by the user logic definition 63 from the library file 4, and stores the data as logic circuit data into the circuit file 2 according to a circuit data preparation program 65 as shown in the diagram of FIG. 16. The program 65 converts the timing simulation definition 64 to data in a format that can be handled by the logic simulator 1, and stores the converted data into the circuit file 2.

The signal file 3 stores external signal and strobe signal data input to the LSI to check the function of the LSI.

The logic simulator 1 executes the logic simulation of the LSI, using the logic circuit data read from the circuit file 2 and external signal data read from the signal file 3. In the logic simulation, a change in an external signal or a change in an internal signal inside the LSI, at the internal time for the simulator 1, is defined and registered as a event. An event as data includes data indicating whether the event is the rising edge or the falling edge of the signal, data indicating where in the circuit the event has arrived (i.e., arrival location data), and data about the time of arrival at the arrival location.

Based on each event at a specific internal time, a change in a signal thereafter generated in the LSI is computed and registered as a new event. When the computation of all events at the specific internal time is completed, the internal time is updated. A similar computation is executed for all registered events at every internal time.

According to this embodiment, timing simulation can be executed for a designated cell during this logic simulation.

The individual components of the logic simulator 1 will now be described. The internal time indicator 7 stores data about a specific internal time (also called "present time") in the logic simulation. The internal time indicator 7 supplies the data about present time to the signal input interface unit 5 and the event processor/register 9.

The signal-change time indicator 6 sequentially holds signal change-time data (i.e., data indicating the timing of the rising or falling of external signal) as one of external signal data input to the processing unit 15 via the signal input interface unit 5. In other words, the indicator 6 holds sequential time data. The signal-change time indicator 6 outputs the signal-change time data, held therein, to the signal input interface unit 5 and the internal time manager 8.

The signal input interface unit 5 receives the present time data from the internal time indicator 7 and the signal-change time data from the signal-change time indicator 6. When the present time data coincides with the signal-change time data, the signal input interface unit 5 reads the external signal data (i.e., data concerning signal rising or falling) from the signal file 3, and supplies the read data to the event processor/register 9.

The dummy element synthesizer 11 is connected to the circuit file 2. This synthesizer 11 loads the logic circuit data and the timing simulation definition 64 from the circuit file 2. Then, the synthesizer 11 produces dummy element data with reference to the timing simulation definition 64, and combines the dummy element data and the logic circuit data. The combined data is stored into the memory 12 by the synthesizer 11. For example, when the logic cell 53 in the logic circuit 50 shown in FIG. 8 is the target for the timing simulation, the dummy element synthesizer 11 produces a dummy element 54 as data for the cell 53 with reference to the simulation definition 64, so that the input pins 53a, 53b and 53c of the cell 53 are connected to the dummy element 54.

The event processor/register 9 receives logic circuit data from the memory 12, data about the signal change from the signal input interface unit 5, and present time data from the internal time indicator 7. The event processor/register 9 registers a change in an external signal or a signal change inside the LSI at the present time as an event. Further, the event processor/register 9 computes changes in internal signals in the LSI which will occur after the present time, based on each event at the present time, and registers the newly occurred changes in the internal signals as new events.

The event counter 10, equipped in the event processor/register 9, manages the number of events and increases the count value of events every time a new event occurs after the logic simulation has started. Every time an event is processed by the event processor/register 9, the counter 10 decreases the count value. The counter 10 outputs data about the number of events on each occasion to the internal time manager 8.

When the event processor/register 9 completes the processing for all the events registered at the present time, the signal output controller 13 executes a strobe process to compare the result of the processing with expected results. The signal output controller 13 executes a trace process to inform an external unit of detected signal changes, and outputs a trace list 14 to a printer (not shown) based on the trace process.

The internal time manager 8 updates the internal time with reference to the count value of the event counter 10 just after the signal output controller 13 finishes its processing. More specifically, when the count value is zero, the internal time manager 8 updates the present time in the internal time indicator 7 to the next time stored in the signal-change time indicator 6. When the count value is other than zero, the internal time manager 8 updates the present time in the internal time indicator 7 by increasing that present time by a given time.

The process that the logic simulator 1 executes at a given internal time will now be described with reference to the main routine illustrated in FIG. 4. At step 21 the event processor/register 9 executes an event process. At step 22 the signal output controller 13 executes the aforementioned strobe process. At step 23 the signal output controller 13 executes the trace process to inform the external unit of signal changes.

Then, the internal time manager 8 determines at step 24 whether or not the count value in the event counter 10 is zero. When the count value is zero, the current internal time is updated at step 25 to the next time when the external signal changes. When the count value is other than zero, the present time is updated by increasing the present time by a given time at step 26.

The event processor/register 9 determines at step 27 if the internal time has reached the end time. If the internal time is not the end time yet, the sequence of processes at steps 21 to 27 is repeated. When it is determined at step 27 that the internal time has reached the end time, the process illustrated in FIG. 4 is terminated.

Figure 4:
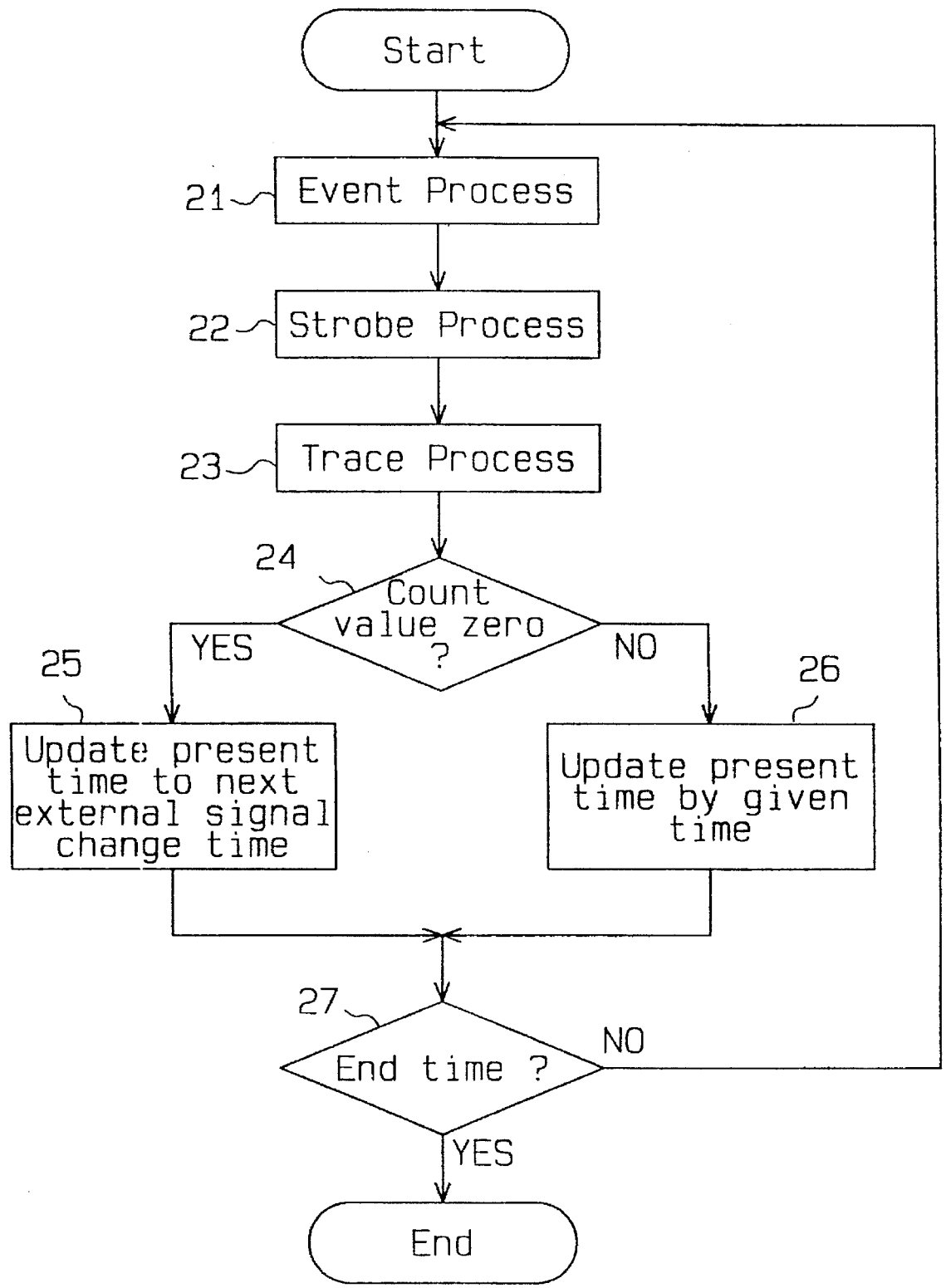
Figure 5:
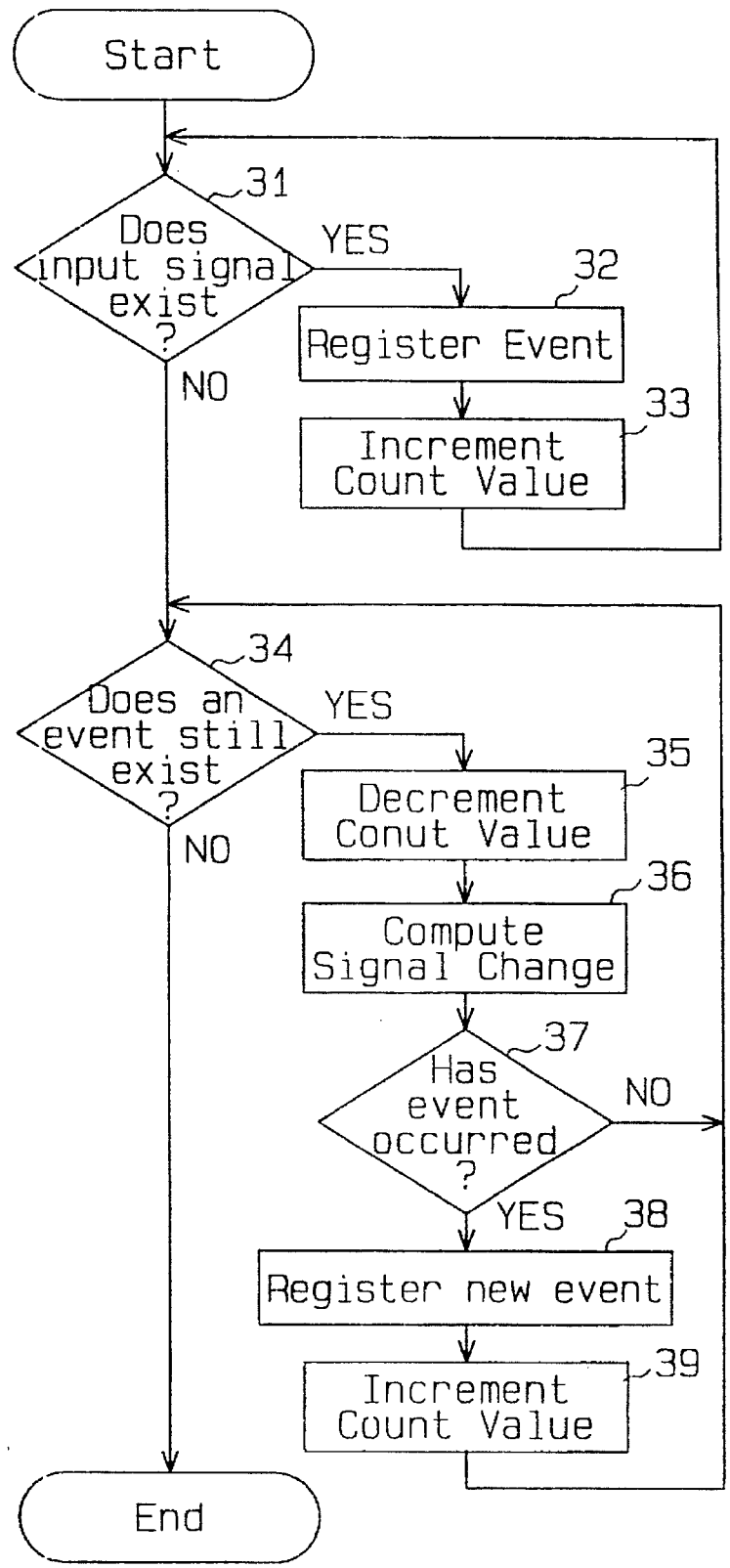

FIG. 5 represents the detailed illustration of the event process that the event processor/register 9 executes at step 21 in FIG. 4. This process is performed based on the event directed simulation method. At step 31 the event processor/register 9 determines if there is any signal input to the event processor/register 9, i.e., if there is any signal change in external signal data. When the decision at step 31 is affirmative, the input signal is registered as an event in an event table (not shown) at step 32. After the registration, the count value in the event counter 10 is increased by "1" (step 33). The processes at steps 31 to 33 are repeated by the number of signal inputs.

Figure 6:
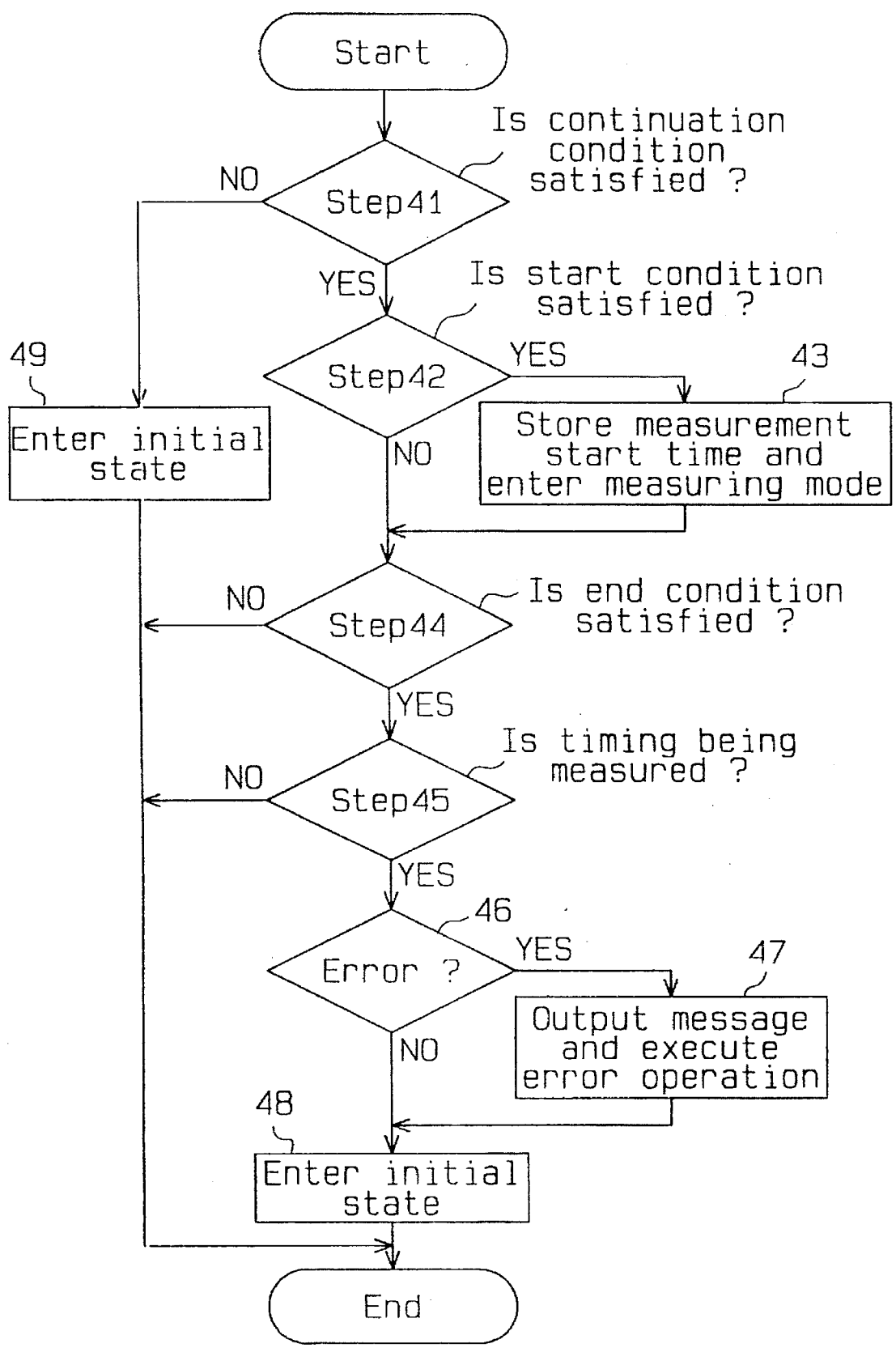
Figure 7:
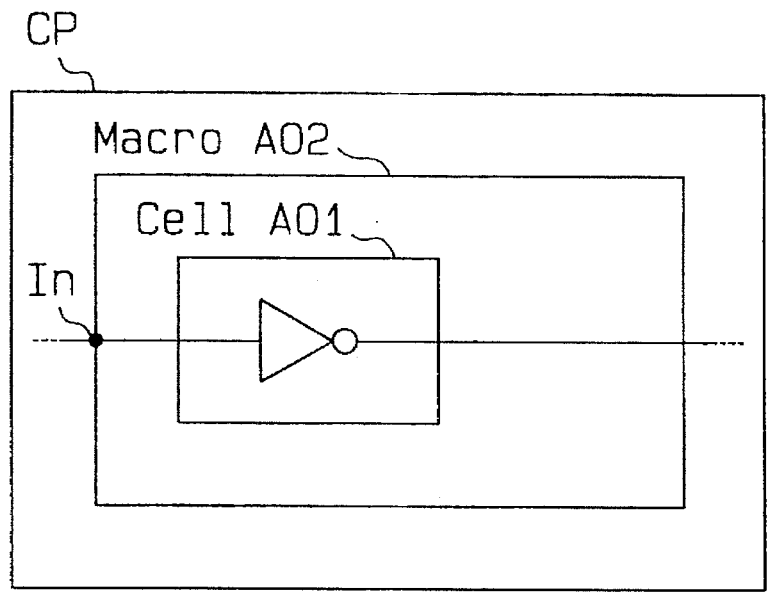

At step 34 the event processor/register 9 determines if there is an event to be processed at the present time, i.e., if there is a change in input signals or signals generated in the LSI. When there is an event to be processed, the count value in the event counter 10 is decreased by "1" at step 35. At step 36, a signal-change computation based on that event is executed to compute changes in internal signals of the LSI which will occur after the present time. If the dummy element that should undergo timing simulation is connected to a logic circuit as data in the memory 12, a timing simulation process illustrated in FIG. 6 is performed at step 36.

At step 37 the event processor/register 9 determines if a new event has occurred as a result of the signal change in the LSI. When a new event has occurred, this event is registered at step 38 and the count value in the event counter 10 is increased by "1" at step 39. The sequence of processes at steps 34 to 39 is repeated by the number of events to be processed at the present time.

The timing simulation process will now be described with reference to FIG. 6. This simulation process is executed for each dummy element as accumulated data in the memory 12. First, it is determined at step 41 if the event satisfies the continuation condition. When the continuation condition is not satisfied, the timing simulation enters the initial status (i.e., the standby state for the simulation) (step 49). When it is determined at step 41 that the continuation condition is satisfied, it is then determined at step 42 if the event satisfies the start condition. When the start condition is met, the time of the event occurrence is registered as the measurement start time and the event processor/register 9 enters the measuring mode at step 43.

After the step 43 or when it is not determined at step 42 that the event has satisfied the start condition, it is determined at step 44 if the event satisfies the end condition. When the end condition is not satisfied, the status at that time (e.g. the measuring mode or the standby state for the timing simulation) is maintained. When the end condition is met, it is determined at step 45 if the timing is being measured. When the timing is not under measurement, the status at that time (the measuring mode or the standby state for the timing simulation) is maintained.

When the measurement of the timing is in progress, the result of the measurement is compared with a specified value to determine if a timing error has occurred (step 46). When the occurrence of a timing error is determined, an error message is output on a display (not shown) and an "error operation", discussed later, is executed (step 47). After the step 47 or when the occurrence of no timing error is determined at step 46, the timing simulation enters the initial state (or the standby state for the timing simulation) at step 48.

Figure 9:
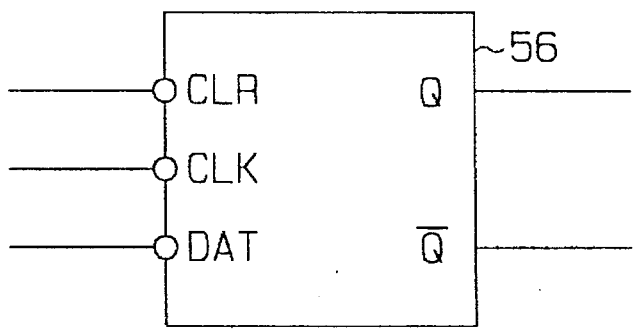

A description will now be given of how the timing simulation is executed according to this embodiment with reference to some examples. FIG. 9 exemplifies a flip-flop circuit (hereinafter called "FF") 56 having a clock terminal CLK, a clear terminal CLR and a data terminal DAT, which need timing simulation. It is necessary to execute the timing simulation of the set-up period of time and hold period of time for such FF 56, so that a dummy element (not shown) is connected in parallel to the FF 56.

Figure 10A:
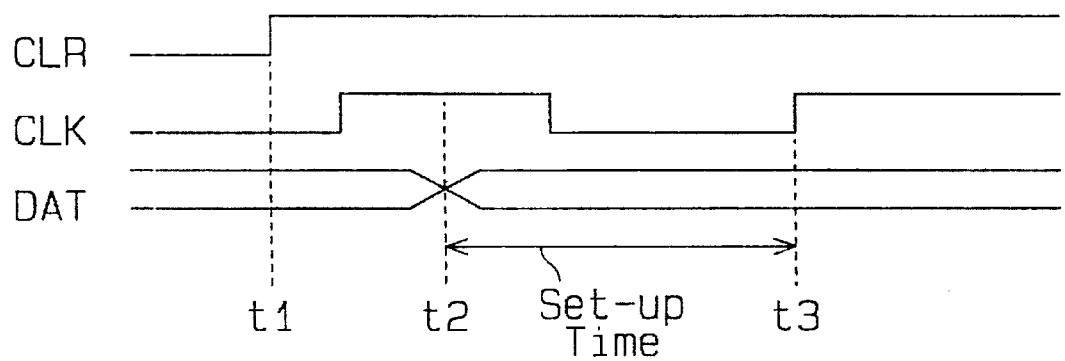
FIG. 10A is a timing diagram illustrating the set-up time of the flip-flop circuit in FIG. 9.

FIG. 10A illustrates the simulation of the set-up time of the FF 56. The start condition for the simulation is defined as a change in the signal at the data terminal DAT. The continuation condition is defined as that the signal at the clear terminal CLR is maintained at an H level. The end condition is defined as that when the signal at the clock terminal CLK rises high. When the measured set-up time is shorter than a predetermined period of time, an "X" signal is set at the output terminal Q of the FF 56. The setting is referred to as an "error operation". In the error operation, a message displaying the violation of the set-up time is output on the display.

When the signal at the clear terminal CLR goes high at time point t1, the continuation condition is satisfied. Since the signal at the data terminal DAT remains constant, the start condition is not met and the current status (the timing measuring mode or the standby state for the timing simulation) is maintained.

The signal at the data terminal DAT changes at time point t2. Since the signal at the clear terminal CLR is maintained high, the continuation condition is met. The signal change at the data terminal DAT causes the start condition to be met. Therefore, this time t2 is registered as the measurement starting time, and consequently, the measuring mode starts. Because the signal at the clock terminal CLK is maintained high at time t2, the end condition is not met. Therefore, measurement of logic timing is maintained.

The signal at the clock terminal CLK goes high at time t3. Since the signal at the clear terminal CLR is already high at that time, the continuation condition is met. Nonetheless, because the signal at the data terminal DAT has not changed, the start condition is not met. The rising of the signal at the clock terminal CLK does however cause the end condition to be satisfied. Therefore, the measuring mode is terminated and the timing simulation enters into a standby state. The time period from time point t2 to time point t3 is obtained as the set-up time. When the time period (t3-t2) is shorter than the predetermined time period, it is determined that a timing error exists. A message informing the violation of the set-up time is output and the error operation of setting the "X" signal at the output terminal Q is executed.

Figure 10B:
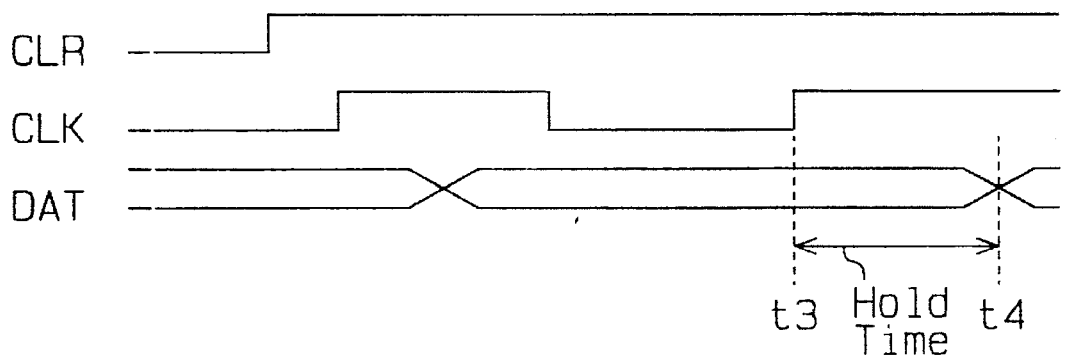
FIG. 10B is a timing diagram illustrating the hold time of the flip-flop circuit in FIG. 9.

FIG. 10B illustrates the simulation of the data hold time of the FF 56. The start condition for this simulation is that the signal a the clock terminal CLK should rise high. The continuation condition is that the signal at the clear terminal CLR should be high. The end condition is that the signal at the data terminal DAT should change. When the measured hold period of time is shorter than a predetermined period of time, an "X" signal is set at the output terminal Q of the FF 56, and the setting is referred to as an error operation. In the error operation, a message displaying the violation of the hold time is output on the display.

The signal at the clock terminal CLK rises high at time t3. Since the signal at the clear terminal CLR is then kept high, the continuation condition is met. The rising of the signal at the clock terminal CLK satisfies the start condition, and as a result, time t3 is registered as the measurement starting point of the timing procedure, and the measuring mode starts. Due to the fact that the signal at the data terminal DAT has not changed at time t3, the end condition is not met and the measuring mode is maintained.

The signal at the data terminal DAT changes at time t4. Then, since the signal at the clear terminal CLR is kept high, the continuation condition is met. Since the signal at the clock terminal CLK is maintained high, the start condition is not met. The change in the signal at the data terminal DAT causes the end condition to be satisfied, and the measuring mode is terminated so that the timing simulation is set to a standby state. The time period from time t3 to time t4 is obtained as the hold time period. Should the time period (t4-t3) be shorter than the predetermined time period, an error is determined to have occurred. As a result, a hold time violation message is output, and the "X" signal is set at the output terminal Q.

Figure 11:
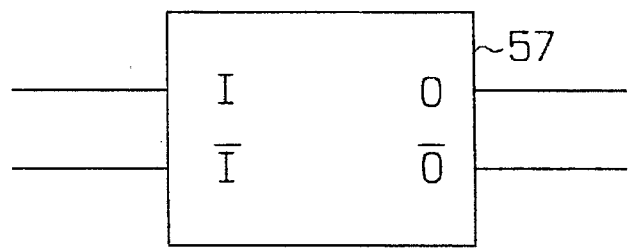

FIG. 11 exemplifies a differential input type logic cell 57 having two input terminals I and /I. This cell 57 needs the timing simulation for the overlap period during which the level of the signal input to the first terminal I is equal to that of the signal input to the second terminal /I. Therefore, a dummy element (not shown) is connected to this cell 57.

The start condition for the simulation of the overlap period is that the signals at the input terminals I and /I should have the same logic level. The end condition is that the inverted level of the signal at the first terminal I should be equal to the level of the signal at the second terminal /I. In this simulation, there is no continuation condition. When the measured overlap period is longer than a predetermined period of time, an error operation, i.e., the setting of an "X" signal at one output terminal, O, of the cell 57, is executed. In the error operation, a message displaying defective phase synchronism is output on the display.

Figure 12:
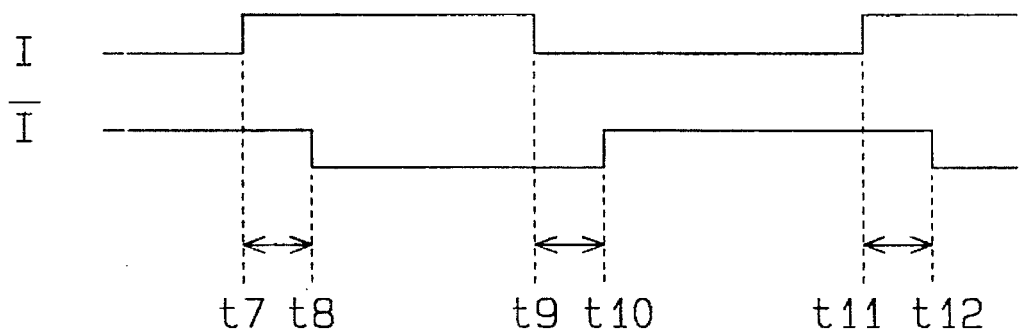

FIG. 12 illustrates the simulation of the overlap period. At time t7, the signal at the first input terminal I goes high, and the signal at the second input terminal /I is kept high. Accordingly, the start condition is satisfied at time t7. The measurement start time is registered, and the measuring mode is started. Since the signals at the input terminals I and /I have the same level at time point t7, the end condition is not met and the measuring mode is maintained.

The signal at the second input terminal /I goes low at time t8, and the end condition is met. Therefore, the measuring mode is terminated and the timing simulation is set to standby. The time period from time t7 to t8 is set as the overlap period. When the time period (t8-t7) is equal to or longer than the predetermined time period, an error is determined to have occurred. An error message is output, and the error operation is executed such that an "X" signal is set at the output terminal O. The timing simulation is likewise executed for the second overlap period between time t9 and t10 and the third overlap period between time t11 and t12.

Figure 13:
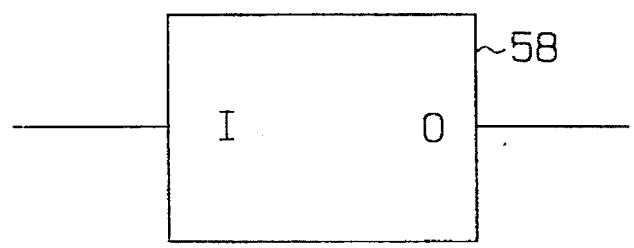
Figure 14:
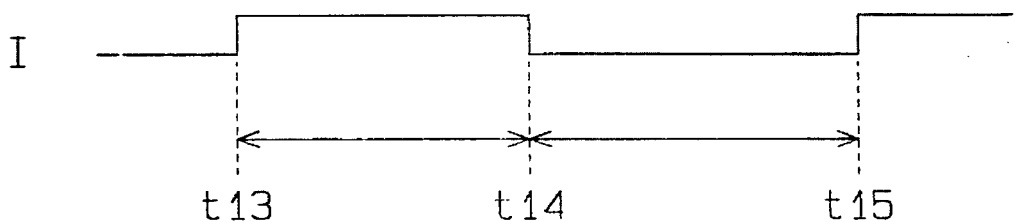
Figure 15:
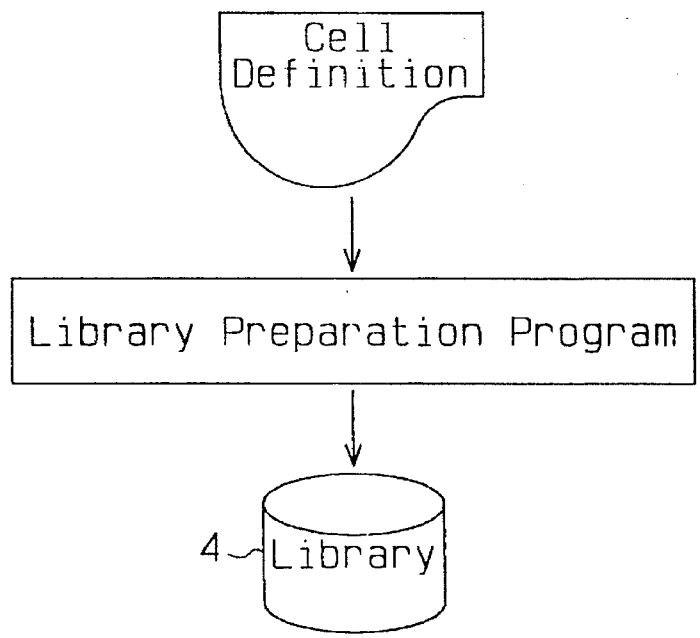

FIG. 13 exemplifies a clock buffer 58 having an input terminal I and an output terminal O. This buffer 58 needs the timing simulation concerning the H-level and L-level pulse widths of the clock signal supplied to the input terminal I, and therefore, a dummy element (not shown) is connected to this buffer 58.

The start condition for the simulation of the L-level pulse width is that the signal at the input terminal I should be low, while the end condition is that the signal at the input terminal I should rise high. There is no continuation condition. When the measured pulse width is shorter than a desired pulse width, an error operation is executed such that an "X" signal is set at the output terminal O. In the error operation, a message displaying the insufficient width of the L-level pulse is output on the display. The start condition for the simulation of the H-level pulse width is that the signal at the input terminal I should be high, while the end condition is that the signal at the input terminal I should fall low. There is no continuation condition. When the measured width of the H-level pulse is shorter than the desired pulse width, an error operation is executed such that an "X" signal is set at the output terminal O. And, a message displaying the insufficiency of the H-level pulse width is shown on the display.

FIG. 12 illustrates the pulse width simulation. The signal at the input terminal I goes high at time t13, so that the start condition for the simulation of the H-level pulse width is satisfied. Time t13 is registered as the measurement starting time when the measuring mode starts. At that time, the signal at the input terminal I is high, the end condition is not met and the measuring mode is maintained.

At time t14, the signal at the input terminal I goes low, the end condition is satisfied and the H-level pulse measuring mode is terminated. The time period from time t13 to t14 is set as the pulse width. When the pulse width (t14-t13) is shorter than the desired pulse width, an error is determined to have occurred, an error message is output, and an "X"signal is set at the output terminal O.

Since the signal at the input terminal I goes low at time t14, the start condition for the simulation of the L-level pulse width is satisfied. This time t14 is registered as the time at which measurement, i.e., the measuring mode starts. Because of the L-level signal at the input terminal I, the end condition is not met and the low level pulse measuring mode is maintained.

The signal at the input terminal I goes high at time t15 when the end condition is satisfied. Consequently, the measuring mode is terminated and the timing simulation is set to standby. The time period from time t14 to t15 is obtained as the low level pulse width. When the pulse width (t15-t14) is shorter than the desired width, an error is determined to have occurred. An error message is output and an error operation is executed such that an "X" signal is set at the output terminal O.

According to this embodiment, the timing simulation definition 64 and the user logic definition 63 are prepared separately as shown in FIG. 16, so that a user (i.e., circuit designer) can handle the timing simulation definition 64. In the design data of an LSI having a hierarchical multi-grade rank of circuits, only the rank designated by the user can be subjected to the timing simulation. In other words, the logic simulator I selectively loads only dummy element data associated with logic cells included in the designated rank, into the memory 12, at the time of executing the logic simulation. This reduces the amount of the logic circuit data targeted for the logic simulation, consequently ensuring fast simulation and shortening the period of the LSI's logic design.

According to this embodiment, the timing simulation definition can be designated or designed for each graded rank of an LSI, so that dummy elements are connected to logic cells in accordance with the simulation definitions for individual ranks. This scheme can suppress an increase in the types of dummy elements and can facilitate the management of dummy elements.

When no event is registered in the logic simulator, the event process is not executed according to this embodiment. This is advantage to shorten the time required for the logic simulation.

Second Embodiment

A description will now be given of the invention according to a second embodiment.

In general, an LSI has a plurality of input terminals and a plurality of output terminals, and one or more input terminals are often laid out close to a group of output terminals. In some cases, a change in the signal at one output terminal generates noise or interference in the input signals to the input terminals adjoining that output terminal, causing the semiconductor device to malfunction. It is important, therefore, that an LSI should be designed so that changes in output signals do not interfere with adjacent input signals. In this respect, there exists the necessity of simulation systems which is useful to such LSI designing.

To achieve this, it is executed to measure the number of changes in the signals at the output terminals per unit time. The number of changes in the output signals is correlated with the possibility of the induction of noises in the input signals. In other words, the smaller the number of signal changes is, the more rare the input noise inductions are. There is a specification for LSIs which is concerned with the allowable number of changes in output signals per unit time.

A general method for checking changes in output signals using a logic simulator will now be discussed in this paragraph. The actual number of times the output signal changes within a predetermined specified time is measured or computed for respective terminal groups, each of which includes some output terminals. The obtained number of signal changes is compared against a predetermined allowable number. When the actual number of signal changes is equal to or smaller than the allowable number, the designed LSI is determined to meet output signal specifications. Otherwise, the designed LSI is not determined to have satisfied the specifications. This analysis is hereinafter referred to as "check of signal change synchronism". Any LSI which does not satisfy the signal change synchronism specifications should be redesigned to satisfy the specification.

A logic simulator according to the second embodiment will shorten the time needed to check the signal change synchronism, thus shortening the overall time of the logic circuit simulation. The logic simulator of this embodiment will now be described with reference to FIGS. 17 to 24.

Figure 17:
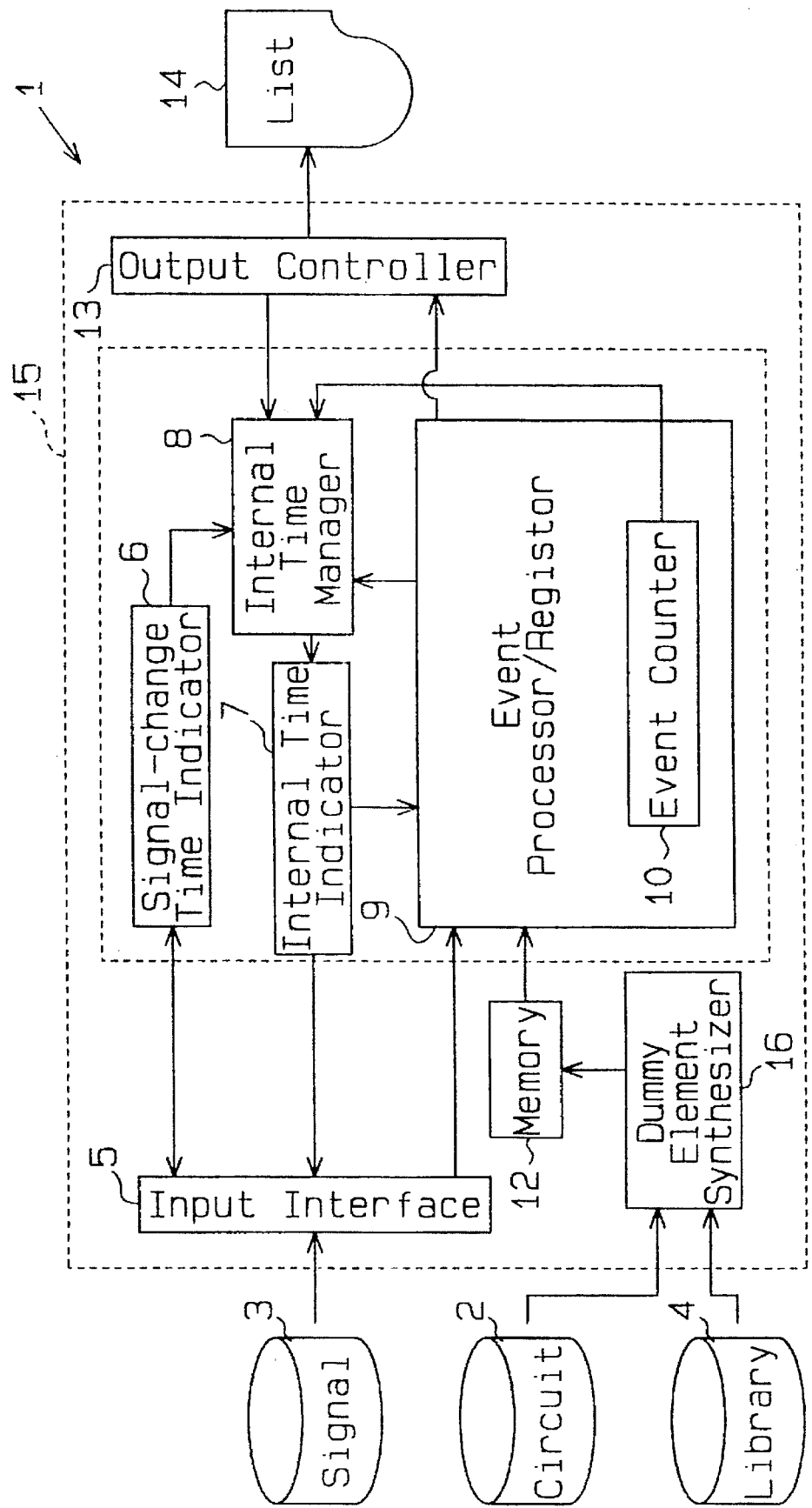
FIGS. 17 through 24 illustrate a second embodiment according to the present invention.

As shown in FIG. 17, like the logic simulator of the first embodiment, a logic simulator 1, incorporated in a CAD system for circuit designing, comprises a circuit file 2, a signal file 3, a library file 4 and a processing unit 15 executed by individual programs that run on a computer. The processing unit 15 includes a signal input interface unit 5, a signal-change time indicator 6, an internal time indicator 7, an internal time manager 8, an event processor/register 9, an event counter 10 in the processor 9, a semiconductor memory 12, a signal output controller 13, and a dummy element synthesizer 16, which produces dummy element data used in the check of signal change synchronism.

The circuit file 2 stores net lists, i.e., logic circuit data for LSIs including plural pieces of logic element data and inter-element network data. One example of an LSI 80 corresponding to circuit data registered in the circuit file 2 is illustrated in a part of FIG. 18. The LSI 80 has a logic circuit 81 including a plurality of logic cells (e.g. an inverter 82 and a buffer 83) and nets N1 to N3, a plurality of input terminals IT1 to IT3 and a plurality of output terminals OT1 to OT3.

Those input terminals IT1–IT3 and output terminals OT1–OT3 are connected to the logic circuit 81 via the nets N1–N3.

A semiconductor integrated circuit (IC) is designed using various logic cells registered in the library file 4. The library file 4 stores cell data about various logic cells and check criteria information used in the check of signal change synchronism. The cell data and check criteria information are prepared in advance by a library designer. Each cell data consists of network data and the data of circuit elements forming a logic circuit. The check criteria information consists of data about a predetermined time period TW used in the signal change synchronism check and data about an allowable number of signal changes at each output terminal within the time period TW, and is prepared for each output terminal of the logic circuit. These time period and allowable number data are used by the dummy element synthesizer 16 to produce a dummy element for use in the signal change synchronism check.

The dummy element as a signal-change detector is virtually connected to the output terminals of the design circuit, at which signal level changes should be checked. Cell data and check criteria information, originally prepared in text format by a library designer, are registered in the library file 4 in a format cognizable and manipulable by the logic simulator.

Figure 18:
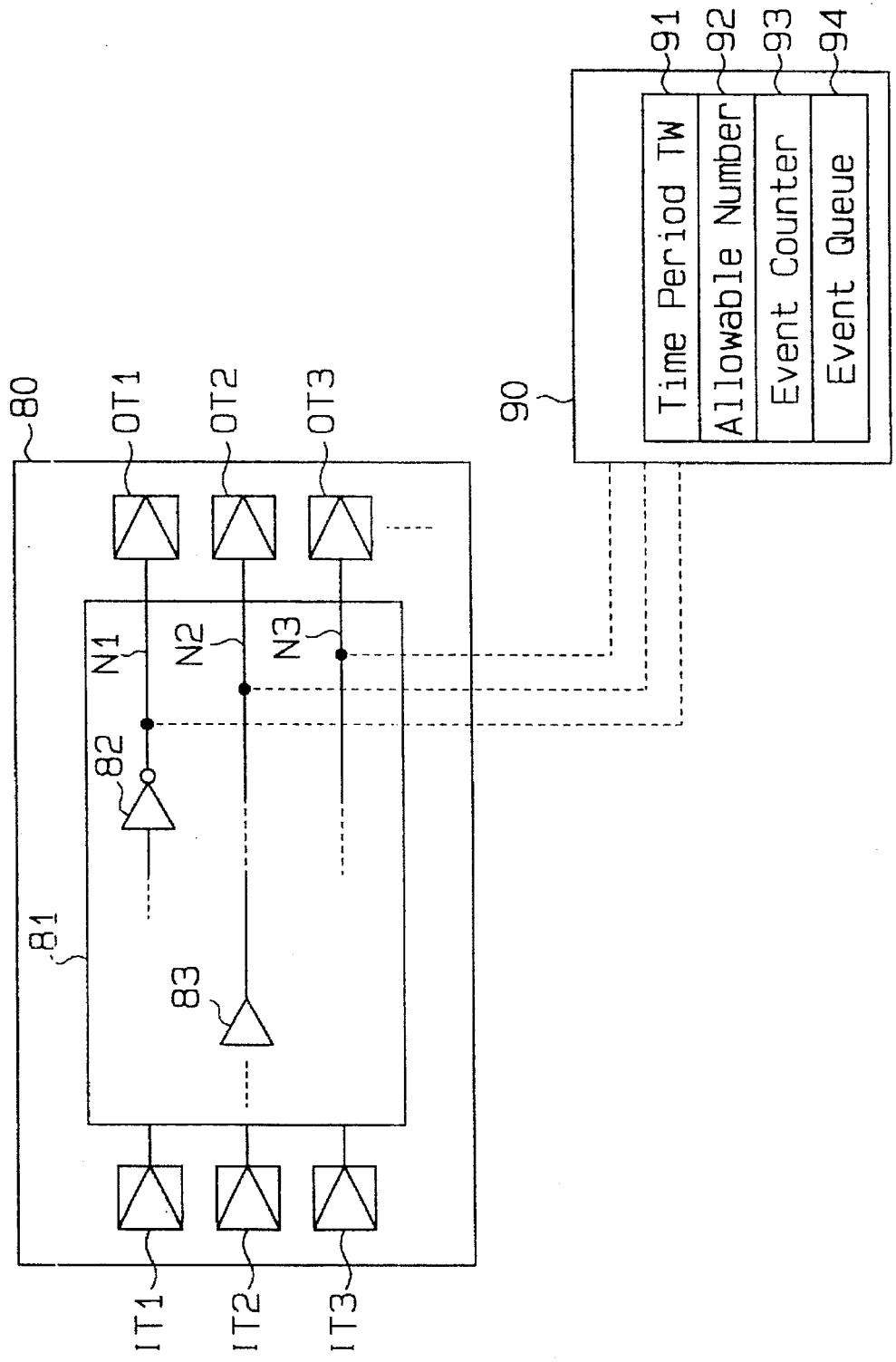
Figure 19:
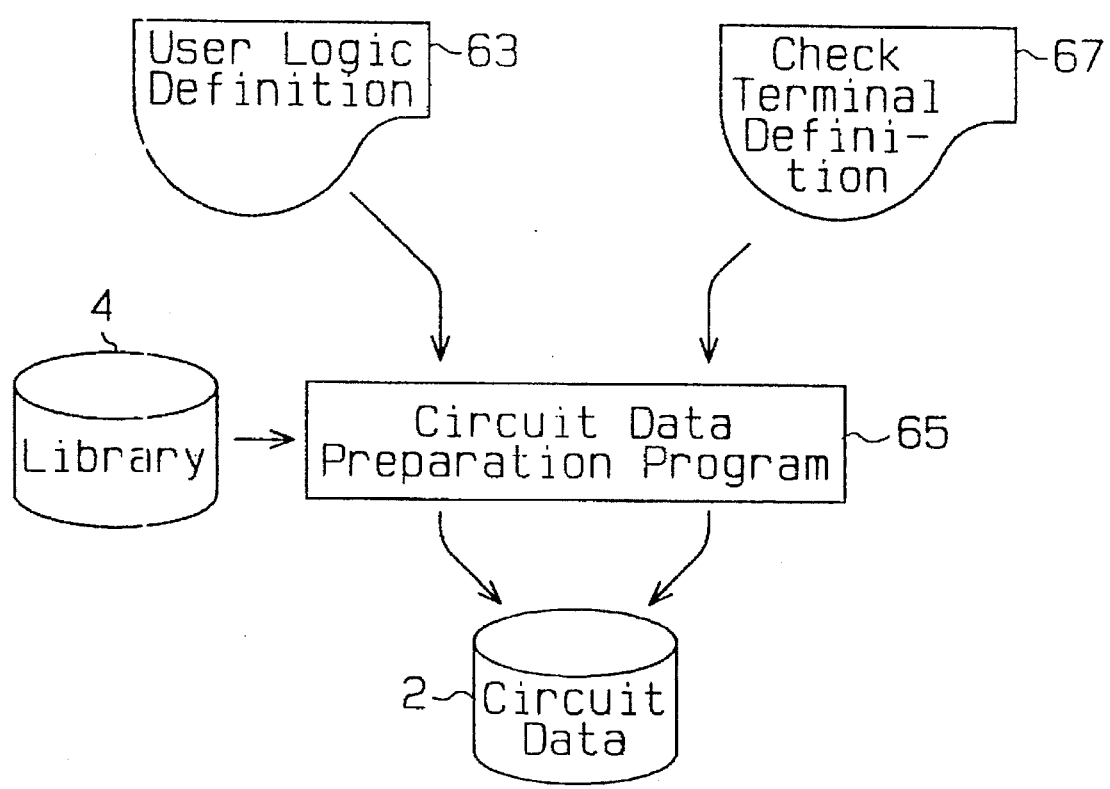

Data in the circuit file 2 is prepared in accordance with the procedures illustrated in FIG. 19 in this embodiment. First, a user or circuit designer prepares a user logic definition 63 and a check terminal definition 67 for the signal change synchronism check. Each definition incorporates a textual data format. The user logic definition 63 can be prepared by designating data about a desired function (e.g., inversion, NAND, or the like) stored in the library file 4. The check terminal definition 67 includes data about a group of the circuit's output terminals whose signal changes should be checked, e.g., data about the output terminals OT1–OT3 of the LSI 80 shown in FIG. 18.

After the text style user logic definition 63 and the text style check terminal definition 67 have been prepared, a circuit data preparation program 68 is activated. Data designated by the user logic definition 63 is then read out from the library file 4 and the data is stored as logic circuit data into the circuit file 2. The circuit data preparation program 68 converts the check terminal definition 67 to data in a format useable by the logic simulator 1, and stores the converted data into the circuit file 2.

The signal file 3 stores data about external signals and strobe signals input to a designed LSI to check the function of the LSI.

The logic simulator 1 executes the logic simulation of the LSI design using the logic circuit data read from the circuit file 2 and external signal data read from the signal file 3 as per the first embodiment. In the logic simulation, as in the first embodiment, a change in an external signal and a change in an internal signal of the LSI, corresponding to the internal time for the simulator 1, is defined and registered as an event. An event as data includes data indicating whether the event is the rising edge or the falling of signal, data about the location of arrival indicating where in the circuit the event has arrived, and data about the time of arrival at the arrival location.

According to the present invention, the check of signal change synchronism is also executed for the designated output terminals OT1 to OT3 using the signal-change detector 90 during logic simulation.

The functions of the internal time indicator 7, the signal-change time indicator 6, the signal input interface unit 5, the event processor/register 9, the event counter 10, the signal output controller 13 and the internal time manager 8 in the logic simulator 1 of this embodiment are the same as those of the corresponding components in the logic simulator 1 of the first embodiment.

The dummy element synthesizer 16 according to this embodiment is connected to the circuit file 2 and the library file 4. This synthesizer 16 loads the logic circuit data and the check terminal definition 67 from the circuit file 2, at the time when the logic simulation begins. The synthesizer 16 also loads the time period data (TW) and the allowable number data applied to the target terminals, from the library file 4, referring to the check terminal definition 67. Based on these data (i.e., check terminal definition 67, time period TW and allowable number), a dummy element data is produced by the synthesizer 16. The synthesizer 16 combines the dummy element data and the logic circuit data, and stores the combined data into the memory 12. For example, if the output terminals OT1 to OT3 of the LSI 80 shown in FIG. 18 are the target terminals whose signal changes should be checked, the dummy element synthesizer 16 connects the dummy element 90 as a signal-change detector in parallel to the output terminals OT1 to OT3 in accordance with the check terminal definition 67.

As known from FIG. 18, the produced dummy element 90 includes therein data 91 about the predetermined time period TW used in the signal change synchronism check and data 92 about the allowable number of signal changes at output terminals within the time period TW. The dummy element 90 further has an event counter 93 and an event queue 94, which exist as subroutines in the dummy element data. The event counter 93 counts the number of events indicating signal changes. The event queue 94 serves as a queue having a FIFO (First-In-First-Out) characteristic for the purpose of managing event data.

The logic simulator 1 according to this embodiment, executes the sequence of steps 21 to 27 in the main routine illustrated in FIG. 4, like the simulator of the first embodiment. The description of those steps 21 to 27 will not be given to avoid repeating the description.

Figure 20:
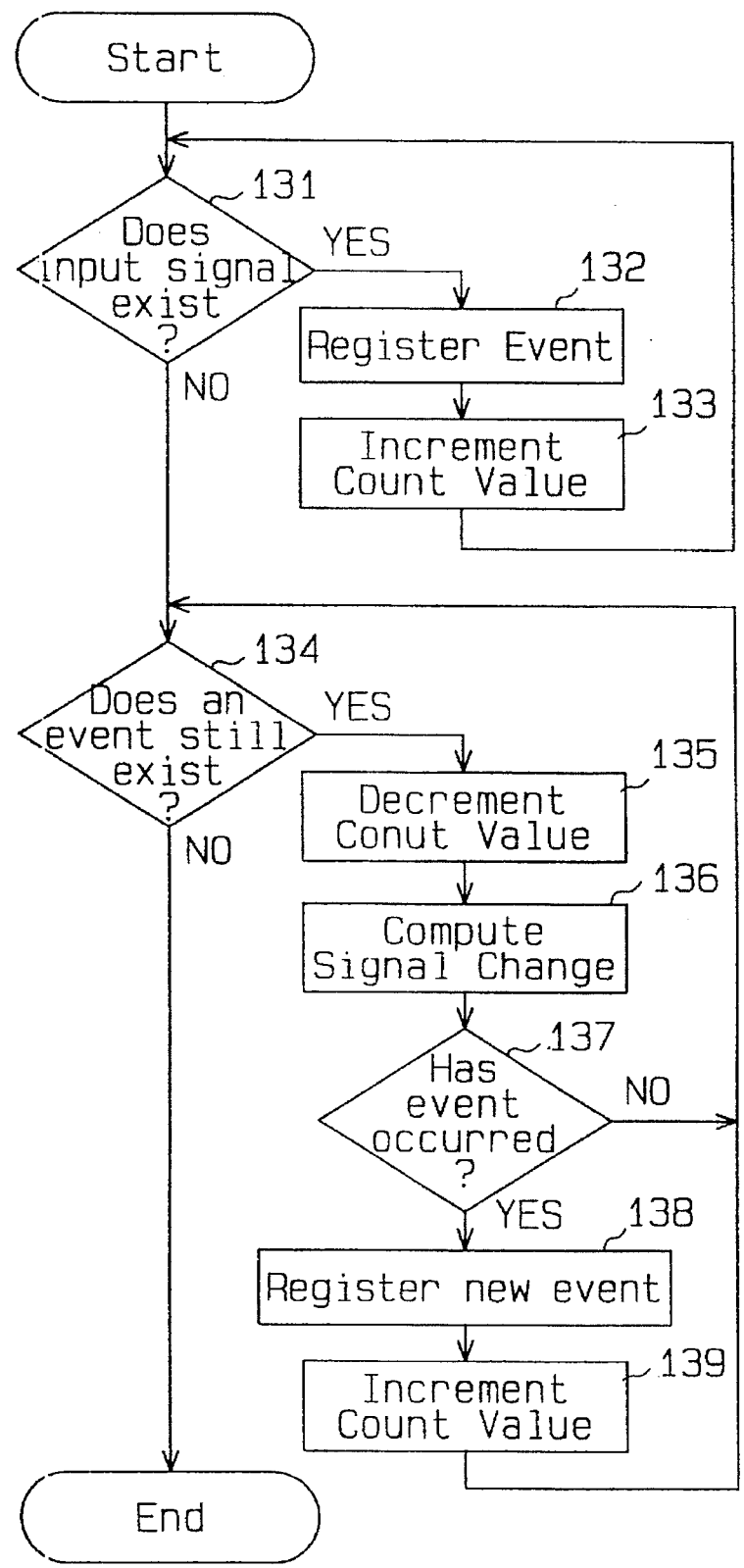
Figure 21:
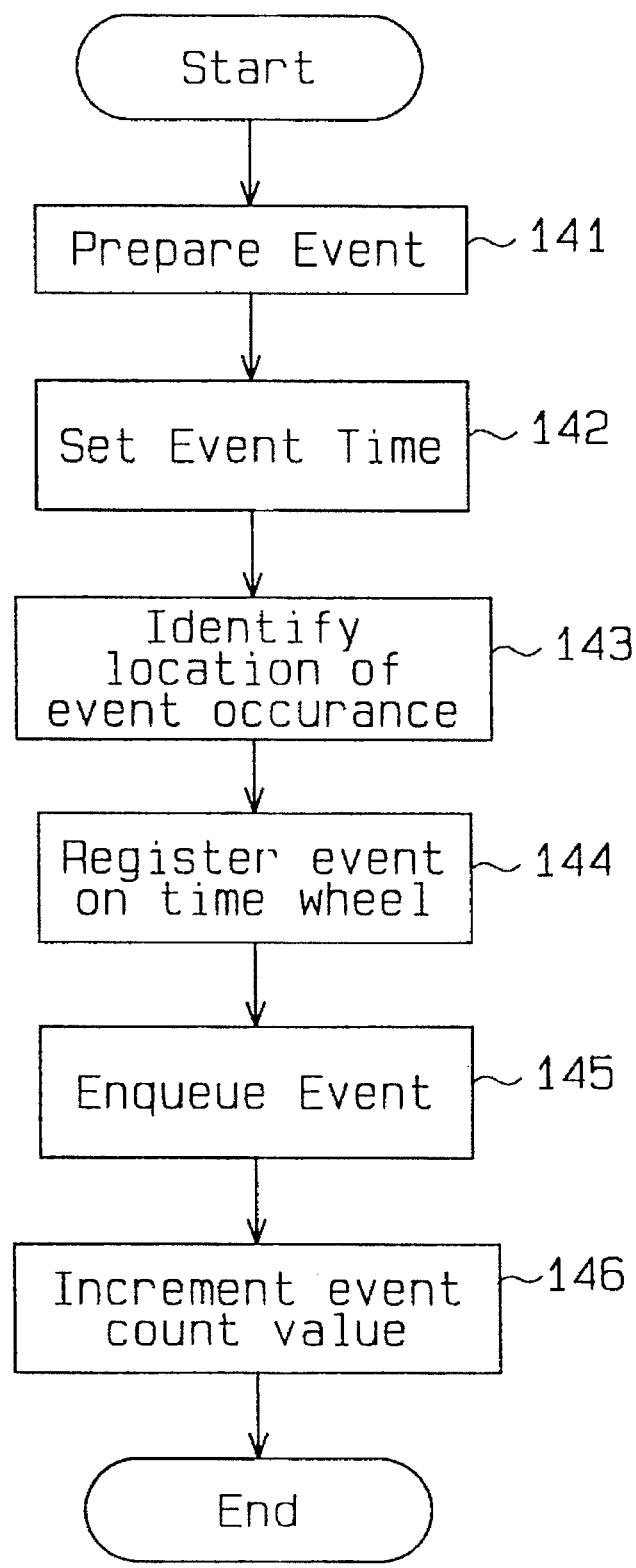

FIGS. 20 and 21 present the detailed illustrations of the processes that the event processor/register 9 executes at step 21 in FIG. 4. The processes are performed based on the event directed simulation method. At step 131 the event processor/register 9 determines if there is any signal input to the event processor/register 9, i.e., if there is any signal change in external signal data. When the decision at step 131 is affirmative, the input signal change is registered as an event on a time wheel 95 (see FIG. 23) as an event table virtually provided in the event processor/register 9 (step 132). After the registration, the count value in the event counter 10 is increased by "1" (step 133). The processes at steps 131 to 133 are repeated by the number of signal inputs.

Figure 22:
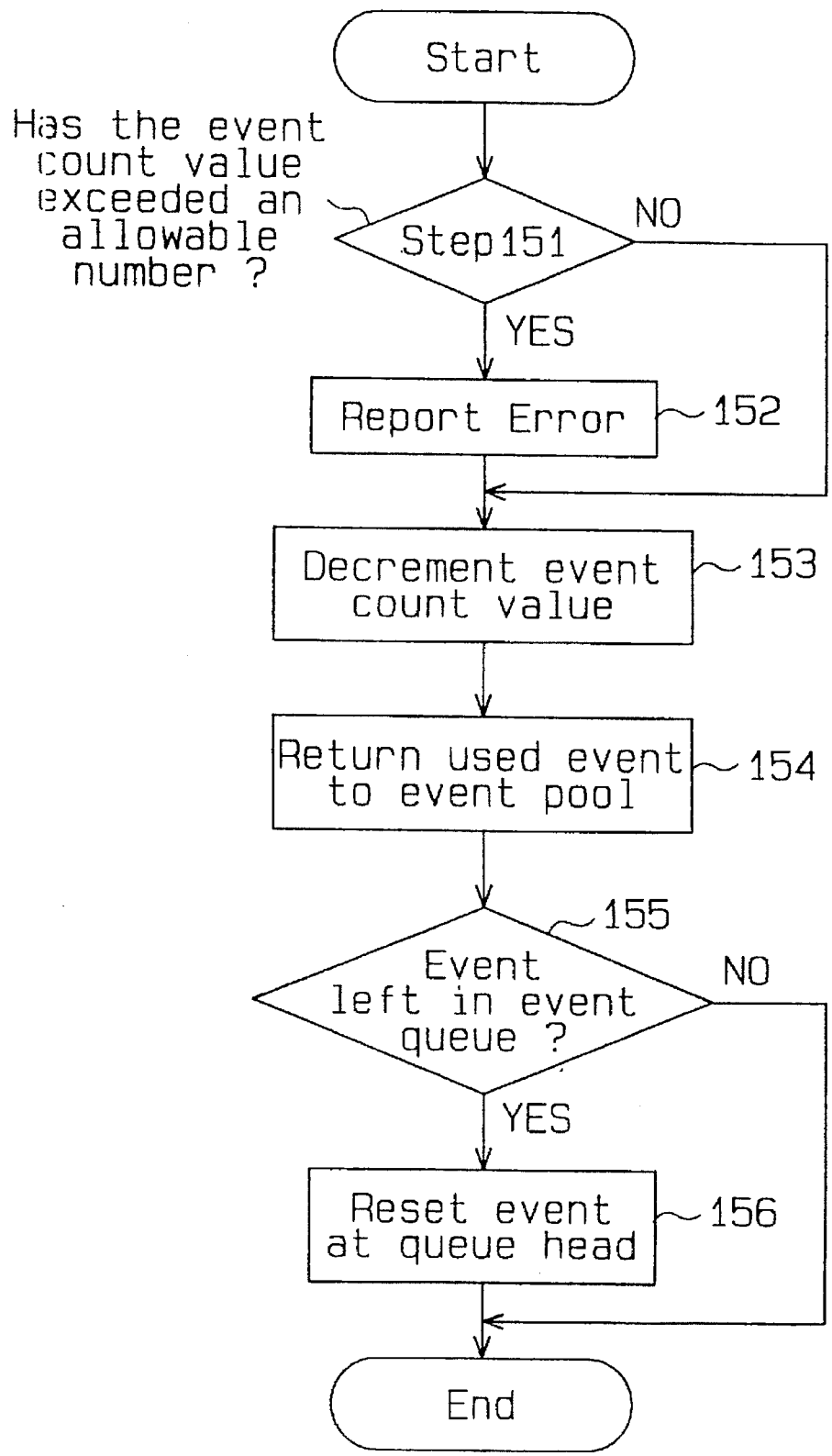

At step 134 the event processor/register 9 determines if there remains an event to be processed at the present time, i.e., if there is a change in input signal or an internal signal in the LSI. When an event to be processed remains, the count value in the event counter 10 is decreased by "1" at step 135. At step 136, a signal-change computing operation is executed referring to that event to compute signal changes in the LSI which will occur after the present time. If the signal-change detector 90 is coupled to a logic circuit as data in the memory 12, the event registration process as illustrated in FIG. 21 and the process for signal change synchronism check as illustrated in FIG. 22 are performed at step 136.

Figure 23:
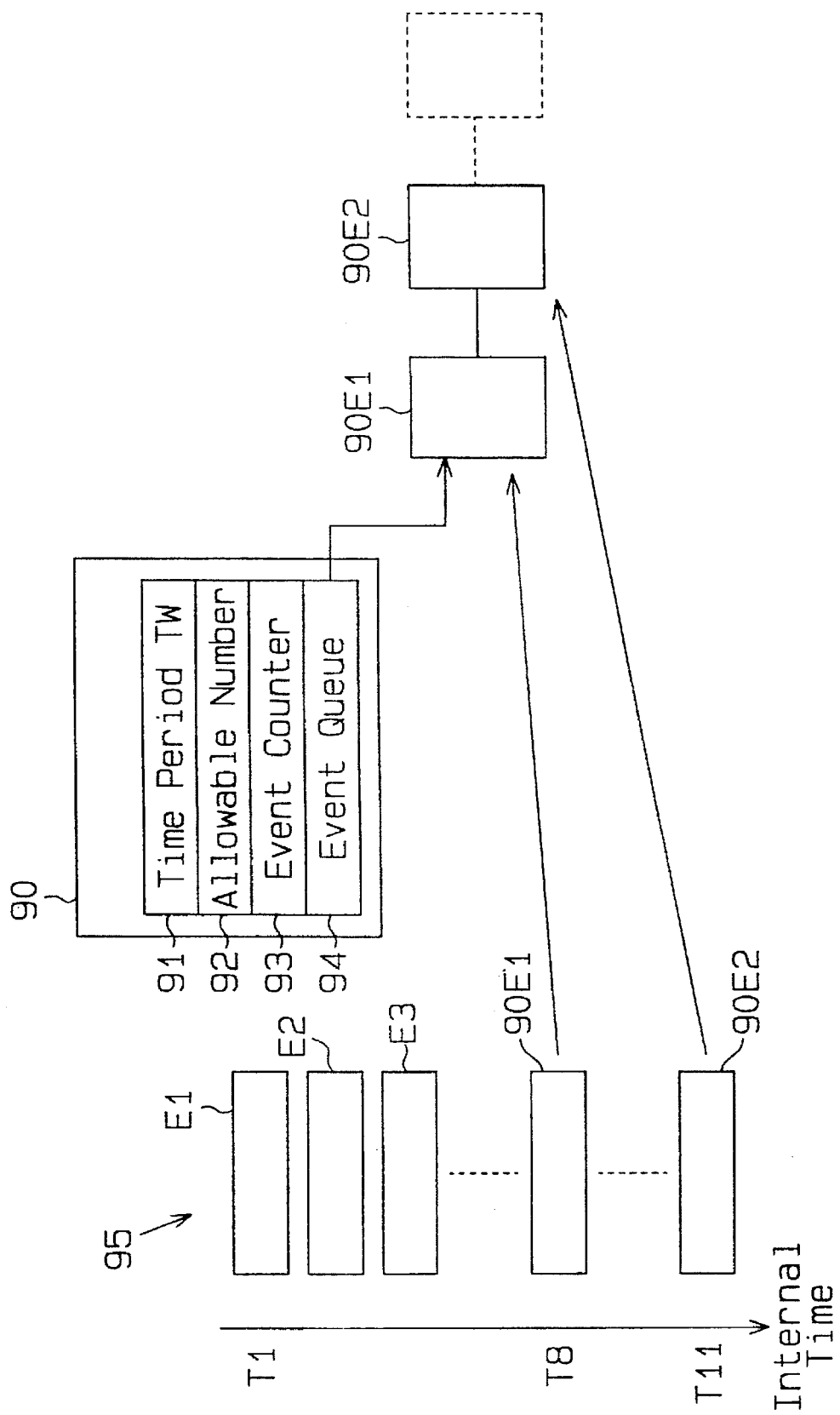

At step 137, the event processor/register 9 determines if a new event has occurred as a result of the signal change in the LSI. When a new event has occurred, the new event is registered on the time wheel 95 (step 138) and the count value in the event counter 10 is increased by "1" (step 139). The sequence of processes at steps 134 to 139 is repeated by the number of events to be processed at the present time. In this manner, for example as shown in FIG. 23, events E1, E2, E3, etc, and events 90E1, 90E2, etc, are sequentially registered on the time wheel 95 (90E1, 90E2 or the like are numbered to events involved in the signal-change detector 90).

A description will now be given of the event registration process and the process of checking the synchronism of the changing signal. Those processes are applied to each signal-change detector as data stored in the memory 12.

Figure 24:
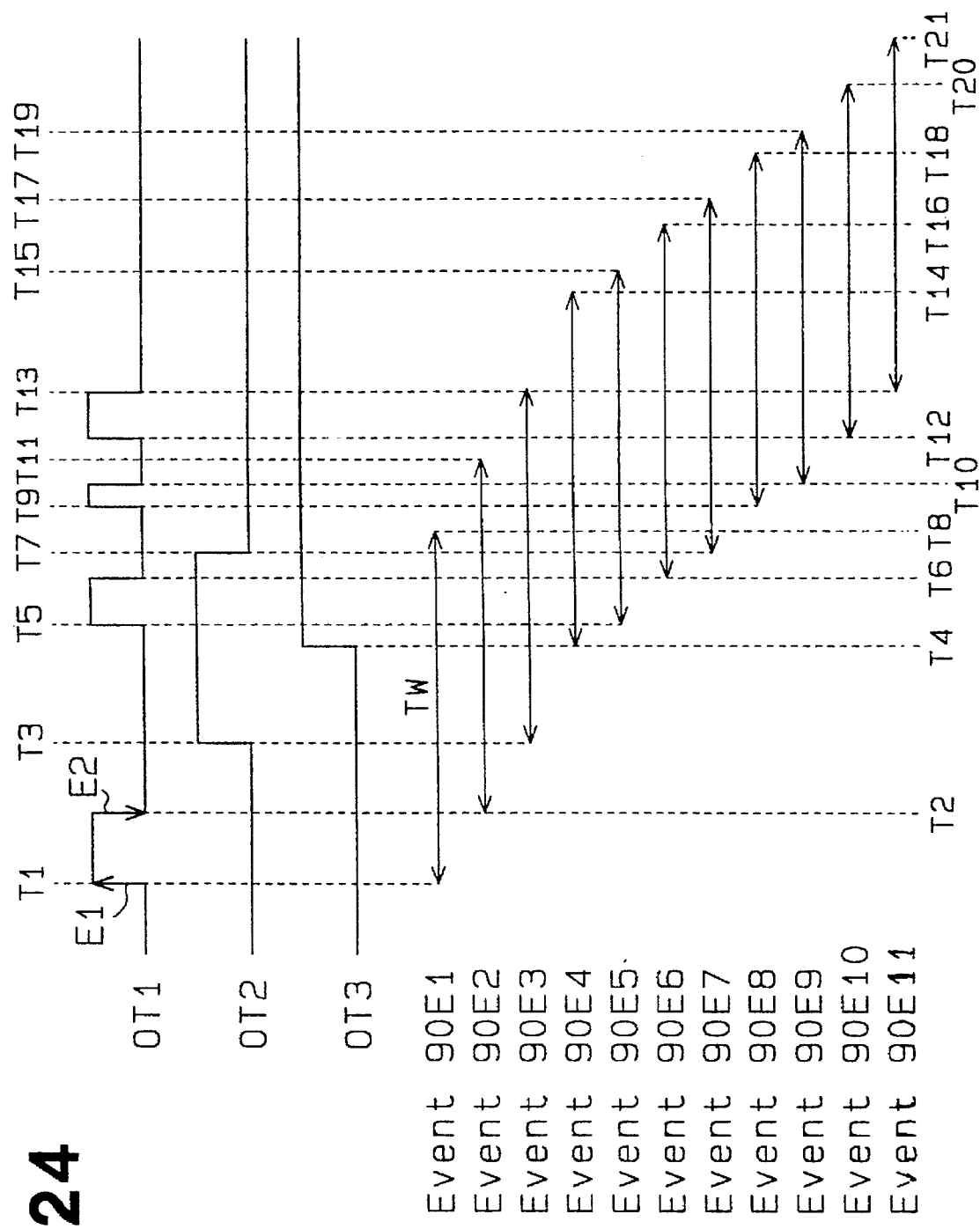

The event registration process involving the signal-change detector 90 as an example will now be described with reference to FIGS. 21, 23 and 24. As shown in FIG. 24, when the event E1 arrives at the output terminal OT1 at time T1 or when the signal-change detector 90 receives the event E1, an empty event holder having no data is pulled out from a pool of event holders (not shown) and is treated as "event 90E1" at step 141. At step 142, time T8, obtained by adding the predetermined time period TW to the present time T1, is set as the time at which the event 90E1 will occurs at the signal-change detector 90. This time is called "event time". At step 143, the detector 90 is identified with the element location where the event 90E1 occurs. Then, at step 144, the event 90E1 is registered in an area on the time wheel 95 corresponding to the time T8. Subsequently, the event 90E1 is registered in the queue 94 at step 145. In other words, the event 90E1 is connected to the tail of the event queue 94. Next at step 146, the count value of the event counter 93 is incremented by "1", completing the registration of a single event.

The registration process shown in FIG. 21 is repeated every time an event arrives at the signal-change detector 90 or at any one of the output terminals OT1 to OT3 of the logic circuit 81 at the current internal time. Accordingly, each of newly generated events 90E2, 90E3, etc, originated from the arrived events is sequentially registered in a specific event time on the time wheel 95, and is registered in the event queue 94. The count value of the event counter 93 increases by the number of newly generated events.

The process of the checking for signal change synchronism will be further described with reference to the flowchart illustrated in FIG. 22 and FIGS. 23 and 24. When the event 90E1 arrives at the signal-change detector 90 at time T8, for example, it is determined if the value of the event counter 93 is greater than that indicated by the allowable number data 92. When the count value is equal to or smaller than the allowable number, the processing sequence jumps to step 153. When the count value exceeds the allowable number, the logic simulator prepares an error report indicating that the specification of the signal change synchronism check is not satisfied, as shown at step 152. Then at step 153 from either step 151 or step 152, the count value of the event counter 93 is decreased by "1" due to the completion of processing the event 90E1. At the subsequent step 154, data of the processed event 90E1 is erased and the empty event holder is returned to the event holder pool.

It is determined at step 155 whether or not there still remains an event in the event queue 94. When no event are pending in the queue 94, the process illustrated in FIG. 22 is terminated. When some events are left in the queue 94, the top event among the remaining events is placed at the head of the queue 94 at step 156 and the process illustrated in FIG. 22 is terminated. In the situation shown in FIG. 23, after the processing of the event 90E1 is terminated, the event 90E2 is located at the head of the queue 94.

The processing sequence in FIG. 22 is repeated by the number of arrivals of the events 90E2, 90E3 and so forth to the signal-change detector 90 at a certain internal time. Suppose, for example, that the signal changes and the event registration to the event queue 94 as shown in FIG. 24 have occurred. In addition, it is assumed that the allowable number of signal changes within the predetermined time period TW is set to "6". As apparent from FIG. 24, seven events (at times T1, T2, ..., T7) have occurred within the time period TW between time points T1 and T8, and will produce seven events 90E1 to 90E7. As the number of signal changes exceeds the allowable number during the period from time T1 to time T8, therefore, an error in the circuit design will be reported.

As can be further seen from FIG. 24, eight events have occurred in the given period TW from time T2 at which the event E2 has occurred to time T11 at which the event 90E2 has occurred in the dummy element; nine events have occurred in the given period TW from time T3, the time of occurrence of the third event, to time T13, the time of occurrence of the event 90E3; eight events have occurred in the given period TW from time T4, the time of occurrence of the fourth event, to time T14, the time of occurrence of the event 90E4; and seven events have occurred in the given period TW from time T5, the time of occurrence of the fifth event, to time T15, the time of occurrence of the event 90E5. In those cases, therefore, an error in the circuit design will be reported.

As compared with the above cases, six events have occurred in the given period TW from time T6, the time of occurrence of the sixth event, to time T16, the time of occurrence of the event 90E6; five events have occurred in the given period TW from time T7, the time of occurrence of the seventh event, to time T17, the time of occurrence of the event 90E7; four events have occurred in the given period TW from time T9, the time of occurrence of the eighth event, to time T18, the time of occurrence of the event 90E8; three events have occurred in the given period TW from time T10, the time of occurrence of the ninth event, to time T19, the time of occurrence of the event 90E9; two events have occurred in the given period TW from time T12, the time of occurrence of the tenth event, to time T20, the time of occurrence of the event 90E10; and one event has occurred in the given period TW from time T13, the time of occurrence of the eleventh event, to time T21, the time of occurrence of the event 90E11. In those cases, therefore, the number of signal changes within the given period TW is equal to or less than the allowable number, which satisfies the specification about the signal changes.

According to the second embodiment, as shown in FIG. 19, the check terminal definition 67 for the signal change synchronism check at the output terminals of the LSI 80 and the user logic definition 63 are prepared separately. Therefore, the user can selectively designate only the output terminals whose signal changes should be checked. This means that the logic simulator 1 manages a specific dummy element data for the designated output terminals, but need not handle any other dummy element data for non-designated output terminals, during the execution of a logic simulation. This results in a reduction of the number of circuit data targeted for the logic simulation, thereby ensuring faster simulation and shortening the LSI design period.

In this embodiment, the check of signal change synchronism at the output terminals of the LSI 80 is carried out during the execution of the logic simulation. This shortens the period for the simulation of the functions of the LSI 80 and the LSI developing period.

When an error report is prepared as a result of the signal change synchronism check, the user may attempt, referring to the error report, to run another simulation in order to input the error-causing signal to an input terminal which is located adjacent to the target output terminals or is surrounded by those output terminals. Such simulation will be useful to analyze the influence of noise caused by frequent signal changes in a very short period of time.

When the logic simulator holds no event, the event process is not performed in this embodiment, thus shortening the overall time need for the logic simulation.

Although only two embodiments of the present invention have been described herein, it should be apparent to those skilled in the art that the present invention may be embodied in many other specific forms without departing from the spirit or scope of the invention.

Particularly, it should be understood that, in the second embodiment, the logic circuit design data for LSIs and the signal-change detector data, defining a dummy element to detect changes in signals at a target terminal to be subjected to signal change synchronism check, may be previously stored in the circuit file 2. The logic circuit design data and the signal-change detector data is loaded from the circuit file 2 into the processing unit 15, at the time that the event driven logic simulation starts, so that the signal change synchronism check is conducted during the execution of the logic simulation. The period for the simulation of the LSI function can also be shortened in such case.

Therefore, the present examples and embodiments are to be considered as illustrative and not restrictive and the invention is not to be limited to the details given herein, but may be modified within the scope of the appended claims.

What is claimed is:

1. A method of executing an event driven logic simulation of a circuit to test the design of logic cells forming the circuit, the method comprising the steps of:

separately storing logic circuit design data and a timing simulation definition in a data base, the timing simulation definition being descriptive of the conditions under which a target cell is subjected to a timing simulation;

loading the logic circuit design data and the timing simulation definition into a processing unit when the event driven logic simulation starts;

producing data defining a dummy element to detect signal levels at a target cell by referring to the timing simulation definition; and combining the dummy element data and the logic circuit data, whereby the timing simulation at the target cell is executed during the logic simulation.

2. The method according to claim 1, wherein the timing simulation definition includes a condition for starting the timing simulation at the target cell, a condition for continuing the timing simulation and a condition for terminating the timing simulation.

3. The method according to claim 2, wherein the timing simulation definition further includes a specified value used to determine if a result of the timing simulation is proper, a sequence of processes to be executed when a timing error has occurred, and information about an error message.

4. A logic simulator for executing a logic simulation of a logic circuit to test the design of logic cells forming the logic circuit, the logic simulator comprising:

a circuit file for separately storing logic circuit data, descriptive of the construction of the logic cells, and timing simulation definitions, descriptive of the conditions under which a target cell is subjected to a timing simulation; and a processing unit, coupled to the circuit file, for executing a timing simulation at the target cell and an event driven logic simulation, said processing unit including a dummy element synthesizer, said synthesizer producing data defining a dummy element to detect signal levels at the target cell by referring to the timing simulation definition for the target cell and combining the dummy element data and logic circuit data, whereby the timing simulation at the target cell is executed during the logic simulation.

5. The logic simulator according to claim 4, wherein said processing unit further includes:

a signal input interface unit for supplying said processing unit with data about external signals to be input to the logic circuit;

an internal time indicator for indicating internal time during the logic simulation;

an event processor operating in accordance with the event driven logic simulation, referring to external signal data, internal time, and the logic circuit data loaded from the circuit file, wherein said event processor computes a change in an internal signal of the logic circuit, and registers the occurrence of the internal signal change as a new event based on a change in the external signal at a specific internal time;

an internal time manger for regulating said internal time indicator to update a current internal time when said event processor completes the processing of all events which occurred at the current internal time; and a signal-change time indicator for sequentially holding external signal change time data introduced into said processing unit by said signal input interface unit, wherein when the current internal time indicated by said internal time indicator matches with the external signal change time indicated by said signal-change time indicator, said signal input interface unit provides said event processor with the data about external signals.

6. The logic simulator according to claim 4, wherein the timing simulation definition includes a condition for starting the timing simulation at the target cell, a condition for continuing the timing simulation and a condition for terminating the timing simulation.

7. The logic simulator according to claim 6, wherein the timing simulation definition further includes a specified value used to determine if a result of the timing simulation is proper, a sequence of processes to be executed when a timing error has occurred, and information about an error message.

8. A method of executing an event driven logic simulation of a logic circuit having a plurality of terminals to test the design of logic cells forming the logic circuit, the method comprising the steps of:

separately storing logic circuit design data and a check terminal definition in a first data base, the check terminal definition designating a target terminal to be subjected to a signal change synchronism check, a signal change synchronism check being defined as a check operation for detecting the number of times of changes in signals at the target terminal within a predetermined unit time period to determine whether the detected number is equal to or below a predetermined allowable number of times;

storing check criteria information used in the signal change synchronism check in a second data base;

loading the logic circuit design data and the check terminal definition form the first data base into a processing unit when the even driven logic simulation starts;

selectively loading the check criteria information from the second data base into the processing unit by referring to the check terminal definition;

producing data defining a dummy element to detect changes in signals at the target terminal based on the check terminal definition and the check criteria information; and combining the dummy element data and the logic circuit data, whereby the signal change synchronism check at the target terminal is executed during the logic simulation.

9. The method according to claim 8, wherein the check criteria information includes data about the predetermined unit time period an data about the predetermined allowable number of times.

10. The method according to claim 8, wherein the second data base is formed by a library file unit, and wherein the check criteria information is prepared by a library designer.

11. A logic simulator for executing the logic simulation of a logic circuit, having a plurality of terminals, to test the design of logic cells forming the logic circuit the logic simulator comprising:

a circuit file for separately storing logic circuit design data and check terminal definition, the check terminal definition designating a target terminal to be subjected to a signal change synchronism check, a signal change synchronism check being defined as a check operation for detecting the number of times of changes in signals at the target terminal within a predetermined unit time period to determine whether the detected number is equal to or below a predetermined allowable number of times;

a library file for storing check criteria information used in the signal change synchronism check; and a processing unit, coupled to said circuit and library files, for executing the signal change synchronism check at the target terminal as well as an event driven logic simulation, said processing unit including a dummy element synthesizer, wherein said synthesizer selectively loads check criteria information from said library file by referring to the check terminal definition, produces data defining a dummy element to detect changes in signals at the target terminal based on the check terminal definition and the check criteria information, and combines the dummy element data and the logic circuit design data allowing the signal change synchronism check at the target terminal to be executed during the logic simulation.

12. The logic simulator according to claim 11, wherein said processing unit further includes:

a signal input interface unit for supplying said processing unit with data about external signals to be input to the logic circuit;

an internal time indicator for indicating internal time during the logic simulation;

an event processor operating in accordance with the event driven logic simulation, referring to external signal data, internal time, and the logic circuit design data loaded form said circuit file, wherein said event processor computes a change in an internal signal of the logic circuit and registers the occurrence of the internal signal change as a new event based on a change in the external signal at a specific internal time;

an internal time manager for regulating said internal time indicator to update a current internal time, when said event processor completes the processing of all events occurred at the current internal time; and a signal-change time indicator for sequentially holding external signal change time data introduced into said processing unit by said signal input interface unit, wherein when the current internal time indicated by said internal time indicator by said signal-change time indicator, said signal input interface unit provides said event processor with the data about external signals.

13. The logic simulator according to claim 11, wherein the check criteria information includes data about said predetermined unit time period and data about the predetermined allowable number of times.

14. The method according to claim 11, wherein the check criteria information is prepared by a library designer.

15. A method of executing an event driven logic simulation of a logic circuit, having a plurality of terminals, to test the design of logic cells forming the logic circuit, the method comprising the steps of:

storing logic circuit design data in a data base;

storing data in the data base defining a dummy element to detect changes in signal at a target terminal to be subjected to signal change synchronism check, wherein the signal change synchronism check is defined as a check operation for detecting the number of times of changes in signals at the target terminal within a predetermined unit time period to determine whether the detected number is equal to or below a predetermined allowable number of times; and loading the logic circuit design data and the dummy element defining data from the data base into a processing unit when the event driven logic simulation starts, whereby the signal change synchronism check at the target terminal is executed during the logic simulation.

* * * * *